United States Patent [19]
Glezer et al.

[11] Patent Number: 5,894,990
[45] Date of Patent: *Apr. 20, 1999

[54] SYNTHETIC JET ACTUATOR AND APPLICATIONS THEREOF

[75] Inventors: Ari Glezer; Mark G. Allen; David J. Coe, all of Atlanta; Barton L. Smith; Mark A. Trautman, both of Decatur; John W. Wiltse, Marietta, all of Ga.

[73] Assignee: Georgia Tech Research Corporation, Atlanta, Ga.

[ * ] Notice: This patent is subject to a terminal disclaimer.

[21] Appl. No.: 08/947,815

[22] Filed: Oct. 9, 1997

Related U.S. Application Data

[63] Continuation of application No. 08/489,490, Jun. 12, 1995, Pat. No. 5,758,823.

[51] Int. Cl.$^6$ .................................................. B05B 17/06
[52] U.S. Cl. .................................................. 239/423
[58] Field of Search ............... 239/4, 102.1, 102.2, 239/398, 461, 363, 362, 418, 423

[56] References Cited

U.S. PATENT DOCUMENTS

| | | | |
|---|---|---|---|
| 1,485,715 | 3/1924 | Robinson | 239/423 |
| 1,878,088 | 9/1932 | Zwikker | 239/423 |
| 2,498,990 | 2/1950 | Fryklund | 259/72 |
| 2,591,083 | 4/1952 | Maier | 51/2 |
| 2,812,636 | 11/1957 | Kadosoh | 239/265.13 X |
| 3,058,014 | 10/1962 | Cawap | 310/8.7 |
| 3,361,067 | 1/1968 | Webb | 103/1 |
| 3,985,344 | 10/1976 | McCord | 259/1 |
| 4,131,505 | 12/1978 | Davis, Jr. | 156/580.1 |
| 4,171,852 | 10/1979 | Hacpticas | 406/85 |
| 4,206,831 | 6/1980 | Welch et al. | 181/159 |
| 4,363,991 | 12/1982 | Edelman | 310/316 |
| 4,369,857 | 1/1983 | Frazzer et al. | 181/159 |
| 4,516,747 | 5/1985 | Lurz | 244/204 |
| 4,533,255 | 8/1985 | Gronholz et al. | 366/108 |

(List continued on next page.)

FOREIGN PATENT DOCUMENTS

| | | |
|---|---|---|
| 3320481 | 12/1984 | Germany . |
| 4-103494 | 11/1967 | Japan . |
| 590503 | 11/1974 | U.S.S.R. . |

OTHER PUBLICATIONS

Ingard et al, "Acoustic Nonlinearity of or Orifice", *The Journal of the Acoustical Society of America*, vol. 42 No. 1 1967 pp. 6–51.

Mednikov et al "Experimental study of intense accoistic streaming" Sov. Phys. Acoust vol. 21. No. 2 Mar–Apr. 1975 pp. 152–154.

Williams et al "The Mechanism of Flow Control on a Cylinder with the Unsteady Bleed Technique" AIAA 91–0039 Jan. 7–10, 1985.

Coe et al "Micromachined Jots for Manipulation of Macro Flows". 1994 Solid–State Sensor and Actuator Workshop, Hilton Head, S.G.

*Primary Examiner*—Kevin Weldon
*Attorney, Agent, or Firm*—Thomas, Kayden, Horstemeyer & Risley, L.L.P.

[57] ABSTRACT

A synthetic jet actuator, which can be micromachined if desired, generates a synthetic jet stream characterized by a series of successive vortices that can be used for effectively entraining adjacent fluid. The synthetic jet actuator can be used to bend, or vector, a jet stream from another jet actuator. Further, because the synthetic jet actuator exhibits zero net mass flux, the synthetic jet actuator can be used within a bounded volume. In structure, the synthetic jet actuator comprises a housing defining an internal chamber and having an orifice. A flexible metallized diaphragm forms a wall of the housing and can change the volume of the chamber when moved. An electrode is disposed adjacent to and spaced from the diaphragm, and an electrical bias is imposed between the metallized diaphragm and the electrode by a control system to force movement of the diaphragm. As the diaphragm moves, the volume in the internal chamber changes and vortices are ejected from the chamber through the orifice.

20 Claims, 15 Drawing Sheets

U.S. PATENT DOCUMENTS

| | | | |
|---|---|---|---|
| 4,548,240 | 10/1985 | Graham | 138/30 |
| 4,611,553 | 9/1986 | Iwata et al. | 118/50 |
| 4,635,749 | 1/1987 | Tattersall | 181/152 |
| 4,697,769 | 10/1987 | Blackwelder et al. | 244/199 |
| 4,747,523 | 5/1988 | Dobbs et al. | 222/383 |
| 4,802,642 | 2/1989 | Mangiarotty | 244/200 |
| 5,040,560 | 8/1991 | Glezer et al. | 137/13 |
| 5,119,840 | 6/1992 | Shibata | 134/184 |
| 5,199,856 | 4/1993 | Epstein et al. | 417/312 |
| 5,203,362 | 4/1993 | Shibata | 134/194 |
| 5,238,153 | 8/1993 | Castillo et al. | 222/189 |
| 5,346,745 | 9/1994 | Bandyopadhyay | 428/156 |
| 5,365,490 | 11/1994 | Katz | 367/1 |
| 5,395,592 | 3/1995 | Bolleman et al. | 422/128 |

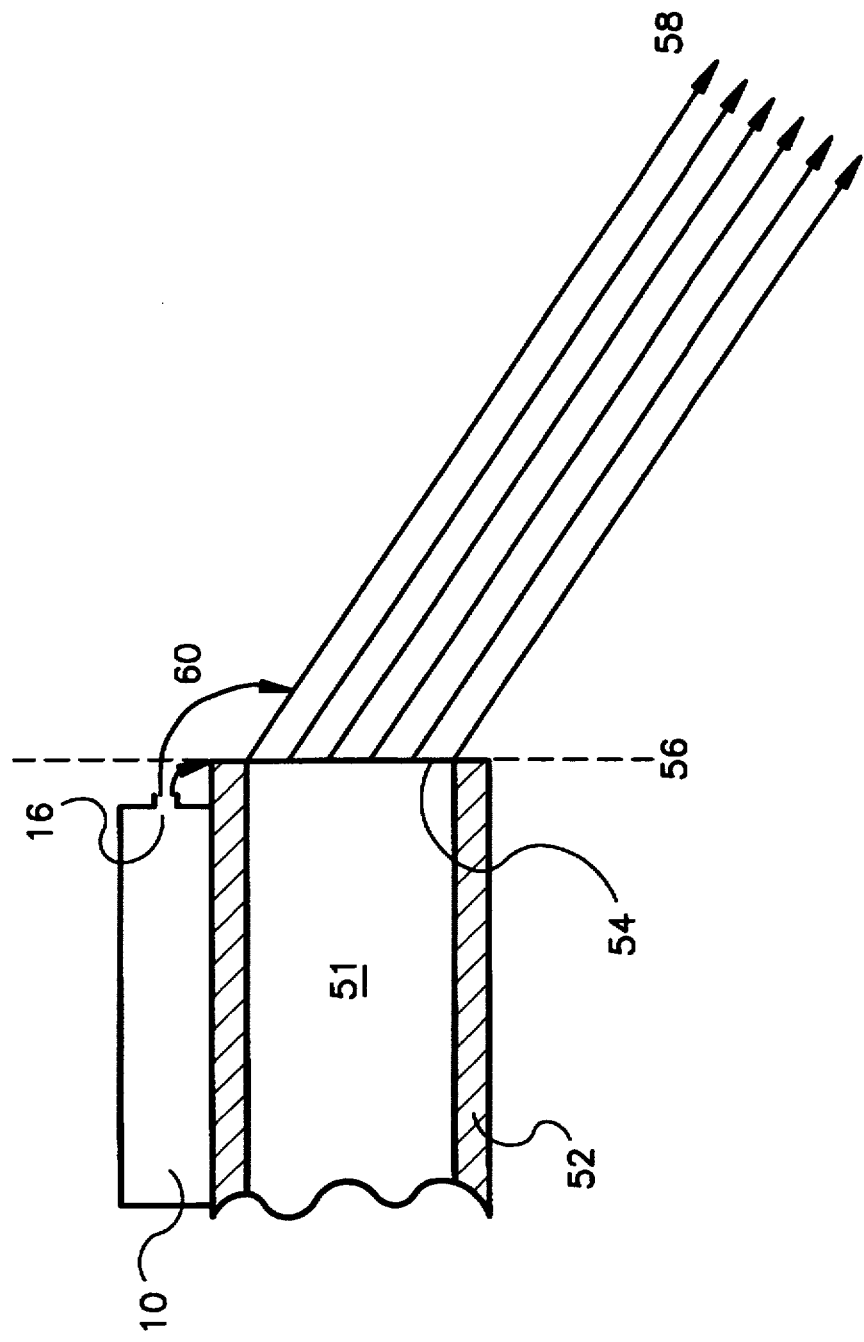

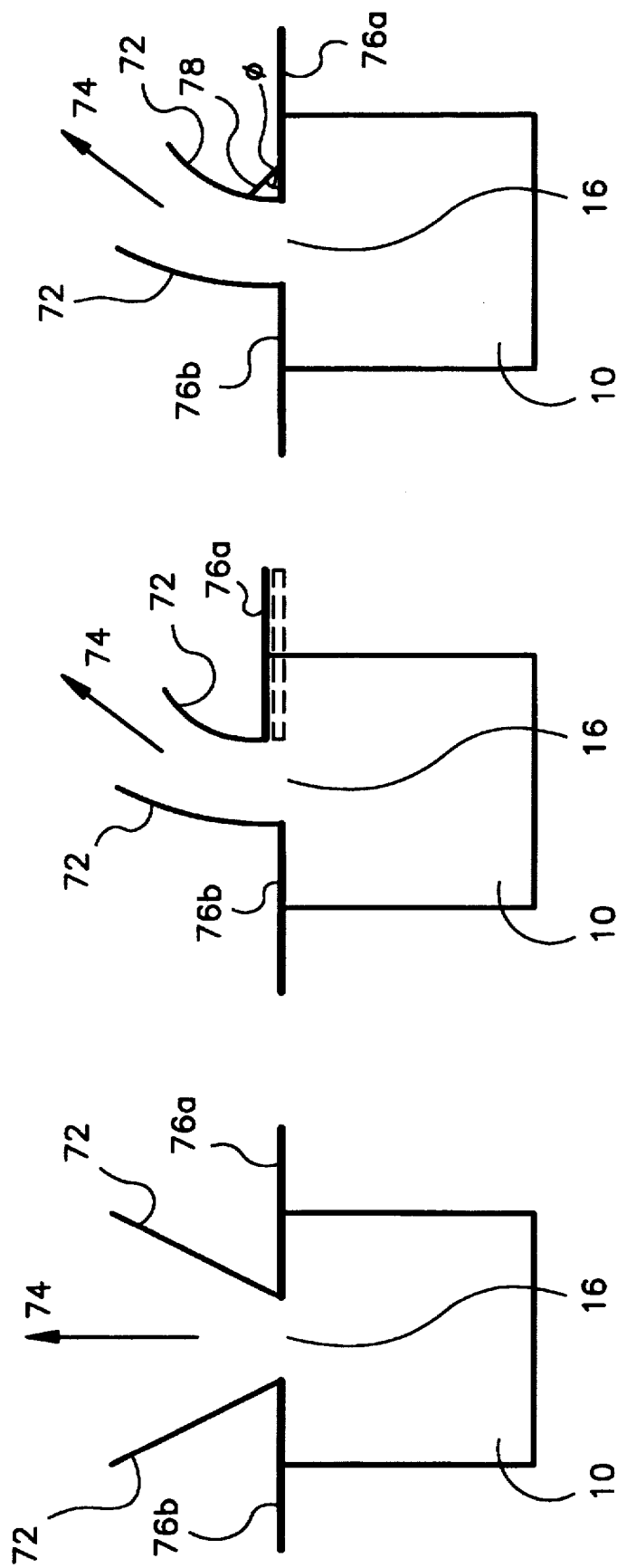

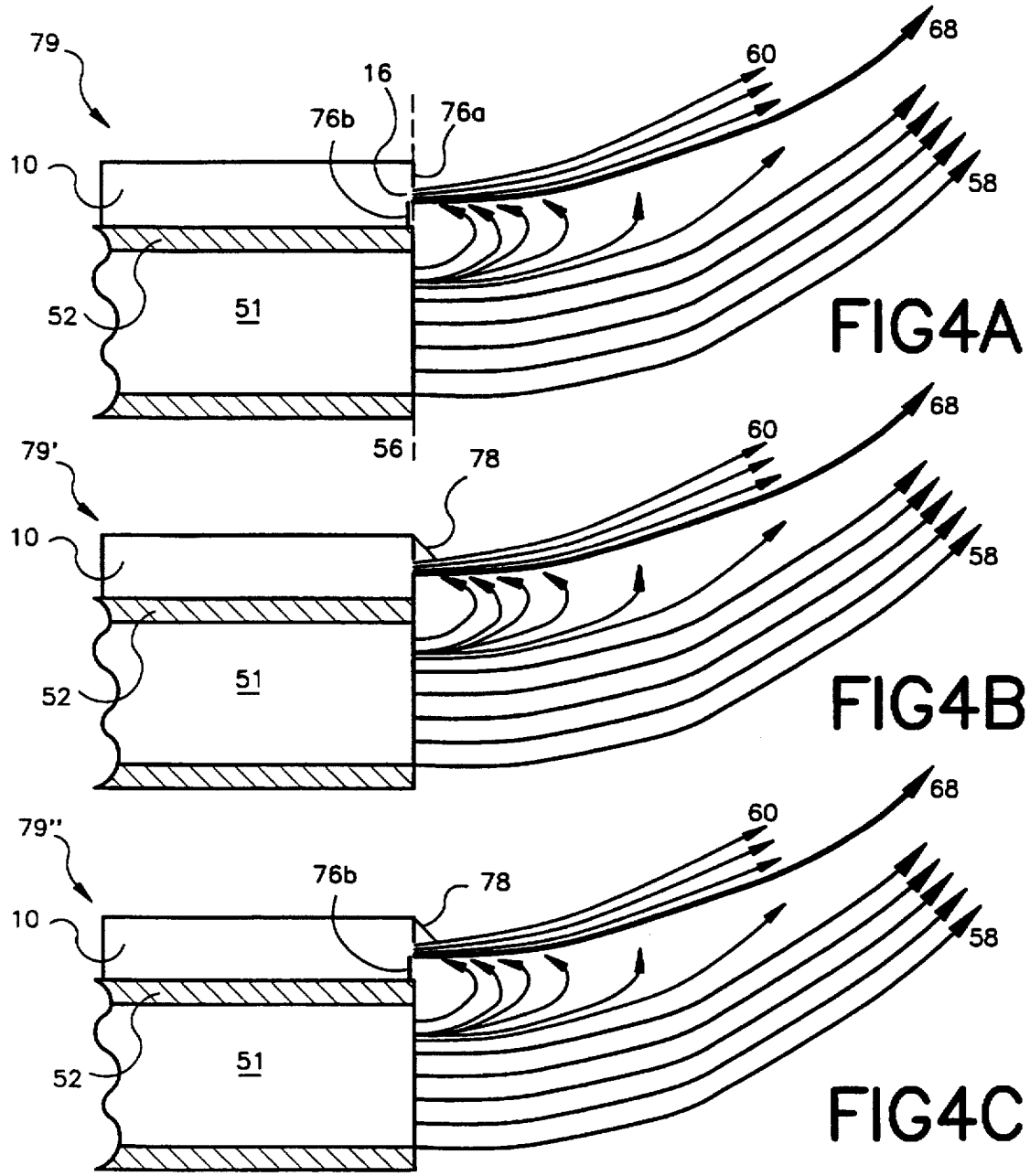

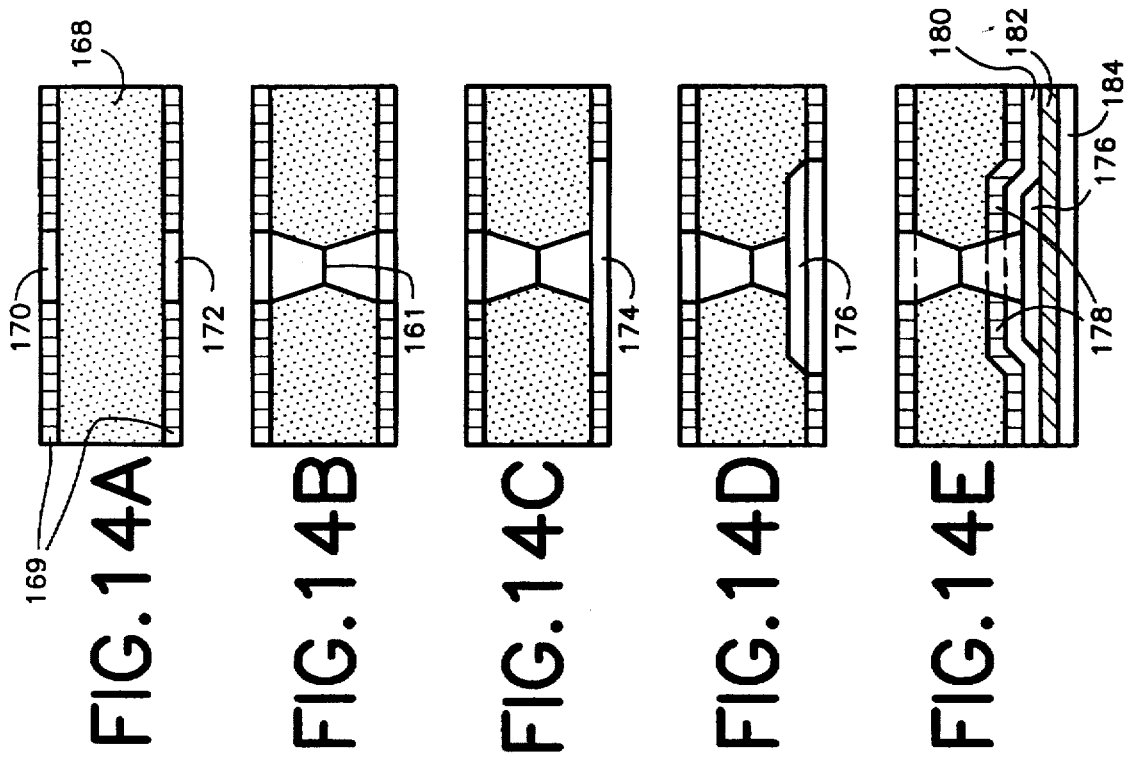
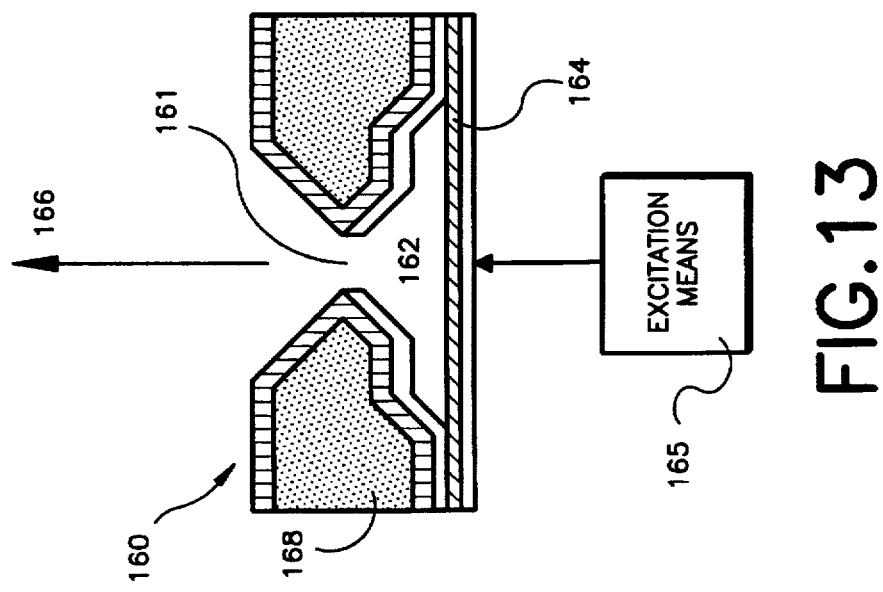

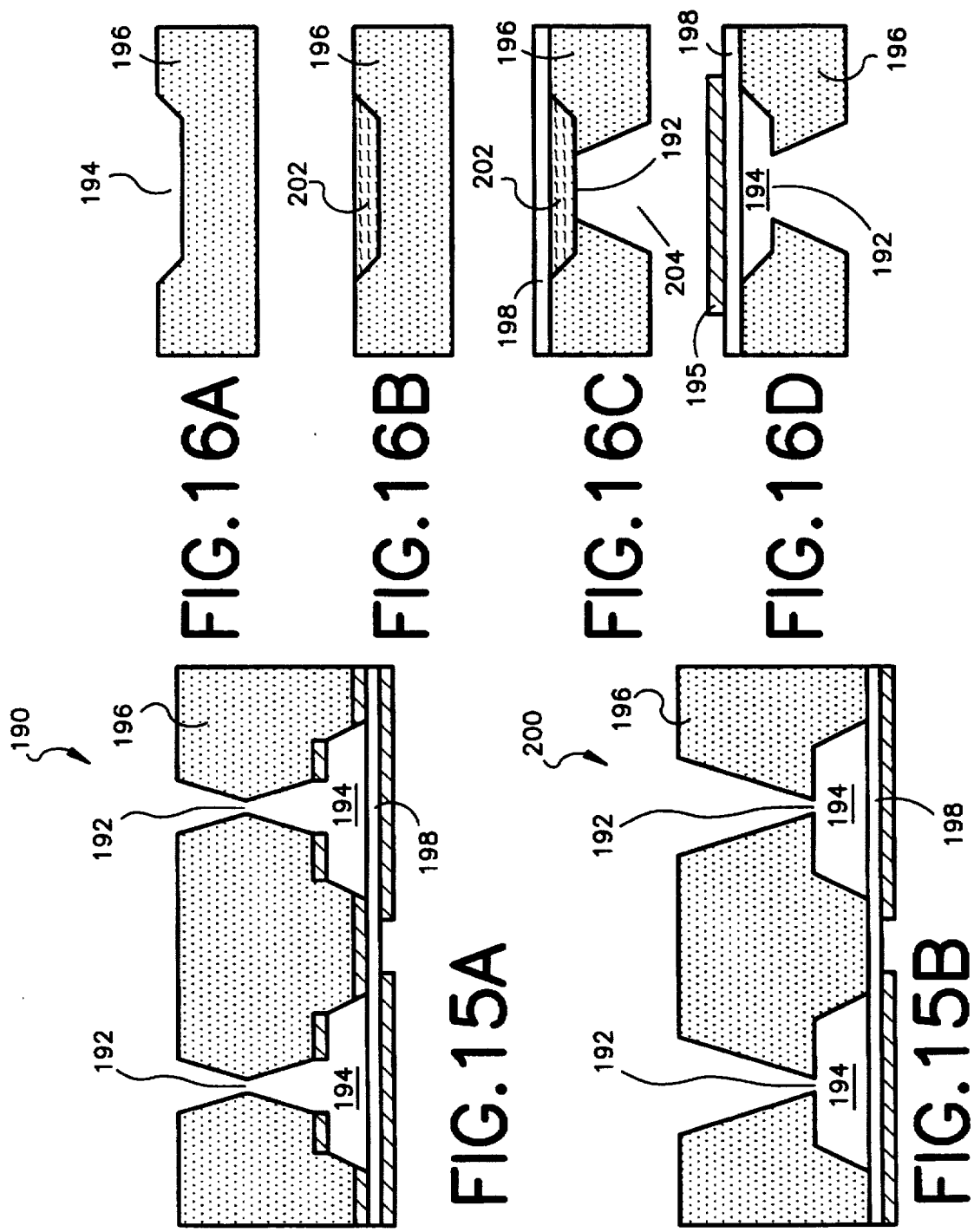

SYNTHETIC JET ACTUATOR AND APPLICATIONS THEREOF

This application is a continuation of application Serial No. 08/489,490, filed on Jun. 12, 1995, now U.S. Pat. No. 5,758,823.

FIELD OF THE INVENTION

The present invention generally relates to fluid actuators for manipulation and control of fluid flow and, more particularly, to a fluid actuator in the form of a synthetic jet actuator that injects fluid with zero net mass but finite momentum and that can modify the direction of another free fluid flow or can create a fluid flow in a bounded volume of the fluid.

BACKGROUND OF THE INVENTION

It was discovered at least as early as 1950 that if one uses a chamber bounded on one end by an acoustic wave generating device and on the other end by a rigid wall with a small orifice, that when acoustic waves are emitted at high enough frequency and amplitude from the generator, a jet of air will be produced radiating from the orifice outward from the chamber. See Ingard and Labate, *Acoustic Circulation Effects and the Nonlinear Impedance of Orifices*, The Journal of the Acoustical Society of America, March, 1950. However, the concern of scientists at that time was only with the relationship between the impedance of the orifice and the "circulation" created at the orifice. There was no suggestion to combine the apparatus with another fluid stream in order to modify that stream's direction of flow. Furthermore, there was no suggestion that such an apparatus could be used in such a way as to create a fluid flow in a bounded volume. Such uses and combinations were not only not suggested at that time, but also have not been suggested by any of the ensuing work in the art.

So, even though a crude synthetic jet was known to exist, applications to common problems associated with other fluid flows or with lack of fluid flow in bounded volumes were not even imagined, much less suggested. Evidence of this is the persistence of certain problems in various fields which have yet to be solved effectively.

Until now, the direction of a fluid jet has chiefly been controlled by mechanical apparatus which protrude into a jet flow and deflect it in a desired direction. For example, aircraft engines often use mechanical protrusions disposed in jet exhaust in order to vector the fluid flow out of the exhaust nozzle. These mechanical protrusions used to vector flow usually require complex and powerful actuators to move them. Such machinery often exceeds space constraints and often has a prohibitively high weight. Furthermore, in cases like that of jet exhaust, the mechanism protruding into the flow must withstand very high heat. In addition, large power inputs are generally required in order to intrude into the flow and change its direction. For all these reasons, it would be more desirable to vector the flow with little or no direct intrusion into the flow. As a result, several less intrusive means have been developed.

In an effort to avoid the problems associated with physical intrusion into a flow, a common method of vectoring a fluid jet is to use another fluid flow as a fluidic control jet. Use of a fluidic jet to vector another flow, while known for years, has been used with little success. In particular, the only way known to vector one jet of fluid with another jet of fluid was to align the control jet so as to impinge on the primary jet directly. This involved injection of mass into the flow and was not very effective at vectoring the primary flow because a direct momentum transfer was relied upon for the direction change. To be at all effective, therefore, the control jet needed to be operated at considerable power. Further, such control was difficult and expensive to install because of the complex plumbing necessary to supply the control jet with fluid to operate.

It has been known for a number of years that substantial modification of shear flows can result from the introduction of small perturbations at the boundaries of the shear flow. This modification occurs because the shear flow is typically hydrodynamically unstable to these perturbations. Such instability is what leads to the perturbations' rapid amplification and resultant relatively large effect on the flow. However, these principles have not been used to vector a fluid flow with any great degree of effectiveness.

Not only is it important for safety or thrust vectoring to control the direction of a fluid flow, but fluid flow about an aerodynamic surface is of great concern. In fact, modification of the aerodynamic characteristics of lifting surfaces has long been a goal of many scientists and manufacturers. Flaps and slats have proven successful in altering the apparent shape and camber of an aerodynamic surface, causing the free stream fluid flow to conform to the new shape. However, because of the complex control system required, flaps are expensive to manufacture and install. Flap systems are not only complex, but usually need considerable space on the interior of the aerodynamic surface for installation. Furthermore, considerable power input is required to operate a flap system because of the mechanical intrusion into a flow. Finally, flaps, being complex mechanical apparatus, are often quite heavy. In some applications, the weight penalty to be paid may destroy the usefulness of the flap altogether.

Other efforts of designers to modify the flow about an aerodynamic surface have centered on injection of energy into the boundary layer of the flow in order to augment lift, reduce drag, delay turbulence onset, or delay flow separation. For example, the method disclosed by U.S. Pat. No. 4,802,642 to Mangiarotty involves the retardation of a flow's transition to turbulence. However, this prior art does not and cannot change the effective aerodynamic shape of the airfoil. That is, the apparatus cannot change the direction of flow of the free stream fluid about the surface. Instead, the apparatus propagates acoustic excitation above the Tollmien-Schlichting frequency in an attempt to disrupt Tollmien-Schlichting waves as they begin to form and thereby delay the onset of turbulence. Although this method changes the drag characteristic of a lifting surface, the mean velocity field and thus apparent aerodynamic shape of the surface remain unchanged.

Such devices as slots and fluid jets have also been extensively employed to inject energy into the boundary layer in order to prevent flow separation. Recently, efforts have turned to the use of piezoelectric or other actuators to energize the boundary layer along an aerodynamic surface. See, for example, U.S. Pat. No. 4,363,991 to Edleman. These techniques, which employ acoustic excitation, change the surface aerodynamic performance by suppressing the naturally occurring boundary layer separation. This method requires the flow state to be vulnerable to specific disturbance frequencies. Although proving to be effective at delaying flow separation, none of these devices alter the apparent aerodynamic shape or mean velocity field of a given aerodynamic surface. Even though the changes in lift and drag that are caused by separation can be somewhat restored, there is no effect before separation occurs and the locus of the stagnation points remain largely unchanged. Therefore, before the present invention, there was no way to alter the effective shape of an aerodynamic surface without the complexity, high expense, and weight penalty of mechanical flaps or slats.

In a somewhat different field of study, the ability to effectively control the direction of a fluid stream may have great impact on the mixing of a fluid jet with the ambient fluid into which it is ejected. For example, mixing a hot exhaust plume with cold ambient air to shorten the downstream distance at which it is safe to work is a potential application.

In free turbulent shear flows mixing takes place within a shear layer between two nominally uniform streams of fluids moving at different speeds. In our example, the hot exhaust and the ambient air move at different speeds and mixing occurs at the boundary of these two flows. This boundary forms the turbulent flow region known as a shear layer. Hydrodynamic instabilities in this shear layer induce a hierarchy of vortical structures. Mixing begins with the entrainment of irrotational fluid from each stream by the large-scale vortical structures. Layers of the entrained fluid are continuously stretched and folded at decreasing scales by vortical structures that evolve through the action of shear and localized instabilities induced by larger vortical structures. This process continues until the smallest vortical scales are attained and fluid viscosity balances the inertial forces. This smallest vortical scale is referred to as the Kolmogorov scale. Thus, a long-held notion in turbulence is that the smallest and largest turbulent motions are indirectly coupled through a cascade of energy from the largest to successively smaller scales until the Kolmogorov scale is reached and viscous diffusion can occur. Turbulent dissipation is the process by which (near the Kolmogorov scale) turbulent kinetic energy is converted into heat as small fluid particles are deformed.

Scalar mixing (of heat or species, for example) is similar, but not identical to momentum mixing. Analogous to the Kolmogorov scale, the Batchelor scale is the smallest spatial scale at which an isoscalar particle can exist before scalar gradients are smoothed by the action of molecular diffusion. If scalar diffusion occurs on a faster scale than momentum diffusion, the Kolmogorov energy cascade breaks packets of scalars down into scales small enough that molecular scalar diffusion can occur (at the Batchelor scale). In this case, the Batchelor scale is larger than the Kolmogorov scale and turbulent motions persist at scales where scalar gradients have been smoothed out by diffusion. If, on the other hand, scalar diffusion occurs on a slower scale than momentum diffusion, turbulent motions stop (at the Kolmogorov scale) before the scalar gradients are smoothed out. Final mixing only occurs after laminar straining further reduces the size of the scalar layers.

Because the hierarchy of vortical structures within the shear layer results from flow instabilities, introduction of controlled disturbances at the flow boundary can be used to effectively manipulate a mixing process. To most effectively control mixing processes in turbulent shear flows, it is highly desirable to control both the large scale entrainment of fluid and the small scale mixing of that fluid. However, control of the small scale mixing until now, has been indirect, relying on manipulation of global two-dimensional and three-dimensional instability modes of the base flow to trigger the breakdown to small scale motion. Because this approach depends on the classical cascading mechanism to transfer control influence to the molecular mixing scales, mixing at the smallest scales is only weakly coupled to the control input. More importantly, mixing control of this nature relies on a priori knowledge of the flow instabilities and associated eigenfrequencies of the particular flow. Specifically, it also requires that the flow be unstable to a range of disturbances, a condition which is not always satisfied. In summary, more efficient control of mixing could be achieved by direct, rather than hierarchical, control of both the large scale entrainment and the small scale mixing. Such a control method has, before now, not been available and is enabled by synthetic jet actuators that are the subject of the present disclosure.

Creating a flow in a bounded volume is very desirable in some situations. Particularly, effective mixing of fluids inside a bounded volume could be achieved without the addition of new species, need for a fluid source or drain, and without a mechanical stirring device, which may require a large power input and place additional geometric constraints on the designer. Flow in a bounded volume is also beneficial to heat transfer processes, such as cooling in a sealed environment.

Some common applications of mixing in a bounded volume are mixing in chemical lasers and mixing for chemical or pharmaceutical products. In addition to these fields, the development of methods for enhancement of mixing through manipulation of the flow in which it occurs will have a direct impact on the performance of various other technologically important systems.

As mentioned above, mixing processes in virtually any technological application take place within plane or axisymmetric turbulent shear flows such as shear layers, wakes, or jets. This includes mixing in a bounded volume by use of a fluid flow or a stirring device. To effectively control mixing processes in turbulent shear flows, it is highly desirable to control both the large scale entrainment of fluid and the small scale mixing of that fluid. However, control of the small scale mixing, until now, has been indirect, relying on the classical cascading mechanism to transfer control influence to the molecular mixing scales. The various problems associated with this reliance were outlined above. Even though more efficient control of mixing can be achieved by direct control of both the large scale entrainment and the small scale mixing, until now, such a control method was not available, especially for bounded volumes.

Effective cooling of heated bodies in closed volumes has also been a long standing problem for many designers. Generally, cooling by natural convection is the only method available since forced convection would require some net mass injection into the system, and subsequent collection of this mass. The only means of assistance would be some mechanical fan wholly internal to the volume. However, often this requires large moving parts in order to have any success in cooling the heated body. These large moving parts naturally require high power inputs. But, simply allowing natural convective cooling to carry heat from the body producing it into the fluid of the volume and then depending on the housing walls to absorb the heat and emit it outside the volume is a poor means of cooling.

Thus, a heretofore unaddressed need exists in the art for apparatuses and techniques to better control the direction of a fluid flow and to produce a fluid flow in a bounded volume. The invention disclosed herein meets these heretofore unmet needs.

SUMMARY OF THE INVENTION

Briefly described, the present invention involves a synthetic jet actuator and its various novel applications. The synthetic jet actuator generates a synthetic jet stream of fluid (liquid or gas) characterized by a series of successive vortices that can be used for effectively entraining adjacent fluid. The synthetic jet actuator can be used for bending, or vectoring, an adjacent jet. Furthermore, because the synthetic jet actuator exhibits zero net mass flux, the synthetic jet actuator can be used to create a jet stream within a bounded volume.

The synthetic jet actuator comprises a housing defining an internal chamber. An orifice is present in a wall of the housing. The jet further includes a mechanism in or about the housing for periodically changing the volume within said internal chamber so that a series of fluid vortices are generated and projected in an external environment out from the orifice of the housing. The volume changing mechanism can be any suitable mechanism, for instance, a piston positioned in the jet housing to move so that fluid is moved in and out of the orifice during reciprocation of the piston. Preferably, the volume changing mechanism is implemented by using a flexible diaphragm as a wall of the housing. A control system is utilized to create time-harmonic motion of the diaphragm. As the diaphragm moves into the chamber, decreasing the chamber volume, fluid is ejected from the chamber through the orifice. As the fluid passes through the orifice, the flow separates at the sharp edges of the orifice and creates vortex sheets which roll up into vortices. These vortices move away from the edges of the orifice under their own self-induced velocity. This is important because as the diaphragm moves outward with respect to the chamber, increasing the chamber volume, ambient fluid is drawn from large distances from the orifice into the chamber. Since the vortices are already removed from the edges of the orifice they are not affected by the ambient fluid being entrained into the chamber. As the vortices travel away from the orifice, they synthesize a jet of fluid through entrainment of the ambient fluid.

In contrast to conventional jets, a unique feature of a synthetic jet actuator is that the actual jet of fluid is synthesized from the working fluid of the medium where deployed. Therefore, linear momentum is transferred to the flow system without net mass injection into the system. This disposition obviates the need for any complex piping or plumbing to the synthetic jet actuator for any application in which it is used. As a result, the zero net mass flux synthetic jet actuator will be much easier to manufacture and be much more readily installed in places where space constraints are critical.

Use of these jets to control the direction of another fluid flow has, before now, not been realized. Furthermore, use of a synthetic jet actuator such as to create a fluid flow in a bounded volume has also not been realized before now.

APPLICATIONS AND ADVANTAGES OF THE INVENTION

The zero net mass flux jet of the present invention has many desirable applications, a few of which are delineated hereafter, as examples.

Use Of Synthetic Jet Actuator With Other Flows

As a first application, the properties of a zero net mass flux synthetic jet actuator as it interacts with a free stream flow can be utilized to control, or vector, a primary jet stream, a conventional jet stream or another synthetic jet stream. Such vectoring is accomplished by exploiting hydrodynamic instabilities of the primary jet near the flow boundary. In this sense, the energy necessary for the manipulation of the jet is extracted from the mean flow itself. Of course, the particular effect of a synthetic control jet on a primary jet is a function of how the system is designed.

In the most simple system, a synthetic control jet is attached to the top housing of a primary jet such that the direction of its flow will be parallel to the direction of the primary jet flow. If the two jets are allowed to operate at the same time, the synthetic jet actuator will have the effect of vectoring the primary jet. If the synthetic control jet orifice is near the exhaust plane of the primary jet, then the primary jet flow will be vectored toward the synthetic control jet. On the other hand, if the synthetic control jet orifice is a great enough distance behind the exhaust plane of the primary jet, then the primary jet will be vectored away from the control jet due to the synthetic jet flow negotiating the ninety-degree turn at the end of the primary jet housing and directly impinging into the flow of the primary jet.

Initially, use of a synthetic control jet to vector a fluid flow is advantageous because the two jets can be parallel. Also, because only the location of the synthetic control jet orifice determines the direction of vectoring, the direction of vectoring can be changed rapidly with a mere shift in the position of the synthetic control jet orifice. Thus, only one jet is needed to vector the primary jet in either of two directions.

Furthermore, using a synthetic control jet to vector another primary jet is quite economical. Because the energy necessary for the manipulation of the primary jet is extracted from the mean flow of the primary jet, the power input to the synthetic control jet can be quite small. Additionally, the controller bandwidth may be very high due to the fact that the flow responds at the frequency of the diaphragm of the synthetic jet actuator. This driving frequency can vary from several hundred Hertz to several kilohertz.

In addition to the vectoring of other fluid streams, the entrainment of ambient fluid that is induced by a synthetic jet actuator near the orifice can be exploited for dynamic vectoring of the synthetic jet actuator itself. This is accomplished by alteration of the synthetic jet orifice shape near the jet exit plane. Such orifice alteration yields a Coanda effect, that is, the attachment of circular and non circular jets to solid surfaces which prevent entrainment of ambient fluid along the path of the jet. Such a Coanda effect, and consequently self-vectoring, can be achieved either by deformation of the orifice directly or by deployment of a small flap near the jet orifice. The small flap is normally flat against the outer wall of the synthetic jet actuator. If a flap is deployed along the wall just above the orifice of a synthetic jet actuator, the synthetic jet flow will be vectored upward, toward the flap. Similarly, if the upper side of the synthetic jet orifice is moved outward from the jet chamber interior, the flow will also vector upward.

The ability of the synthetic jet actuator to self-vector, can be used to enhance the vectoring effect that a synthetic control jet will have on a primary jet. When a synthetic jet actuator is placed on the upper housing surface of a primary jet with both orifices in the same exhaust plane, the primary jet flow will be "pulled" upward, as described above. When the synthetic jet actuator is self-vectored by deployment of a flap above its orifice or moving the upper wall forming the orifice outward, more of the fluid supplied to the synthetic jet will come from below its orifice than from above. Thus, it will draw the primary jet toward it with more force, and the amount of directional change in the primary jet will be enhanced.

Another possible application of a synthetic jet actuator controlling the flow of another fluid stream involves the modification of the apparent aerodynamic shape of various solid bodies in fluid flows. When a synthetic jet actuator is embedded in a solid body, with the jet orifice built into the body surface, the interaction of the primary flow with the synthetic jet actuator will change the direction of fluid flowing around the solid body. Modification of flow direction near such a solid body occurs by the synthetic jet actuator creating a permanent recirculation region near the jet orifice. This recirculation region can be formed because a synthetic jet actuator does not dispense any new fluid into the flow. Thus, when a synthetic jet actuator is enclosed in a solid body with the jet orifice at the surface, the result is a change in the apparent aerodynamic shape of that solid body.

As a simple example, a synthetic jet actuator can be embedded in a relatively thin cylindrical section. In this configuration, the synthetic jet orifice could be designed to be in one of the flat, end walls of the cylindrical section. The diaphragm of the synthetic jet actuator could comprise the opposite flat, end wall of the cylindrical section. If such a body is placed in a fluid flow field with one of the blunt walls facing the fluid flow, the synthetic jet actuator will modify the aerodynamic forces on the blunt, cylindrical body by creating a low pressure region along the surface of the cylindrical section due to alteration of the fluid flow pattern about the cylindrical section.

Another example of using a synthetic jet actuator in a solid body, but not limited to this example, is use of a synthetic jet actuator to modify the aerodynamic shape of a lifting surface in a flow field. Similar to the situation when a synthetic jet actuator is embedded in a blunt body, the synthetic jet actuator embedded in a solid lifting surface creates a permanent recirculation region near the jet orifice. Such a recirculation region modifies both the flow field and pressure distribution around the aerodynamic lifting surface thereby modifying both lift and drag characteristics of the surface. In particular, because the aerodynamic characteristics of an airfoil depend critically on the location of its front and rear stagnation points and on its camber and thickness, these characteristics can be altered by zero net mass flux jet actuators without the use of movable flaps. Placement of jet arrays along the leading and trailing edges and along the upper and lower surfaces of an airfoil can result in displacement of its front and rear stagnation points and changes in its apparent thickness and camber, respectively. Addressable jet arrays can also be used to dynamically tailor and optimize the aerodynamic performance so that premature flow separation and thus loss of lift is prevented.

Synthetic jet actuators could also be used in a similar manner to modify the throat area of a diffuser nozzle, to modify the area of a jet engine inlet or exit, or to modify the apparent aerodynamic shape of a variety of objects in mean fluid flow regimes. Furthermore, the ability of a synthetic jet actuator to create a low pressure region in the area of its orifice could also be exploited advantageously in various embodiments.

Once again, it is important that synthetic jet actuators are synthesized from the working fluid of the flow system in which they are employed. This feature obviates the need for expensive and bulky input piping and complex fluidic packaging. These attributes of zero pet mass flux synthetic jet actuators also make them suited for low-cost batch fabrication. This is in stark contrast to the prior art usage of flaps or slats to change the flow about an aerodynamic surface.

Synthetic jet interactions with other fluid streams can also be used in mixing applications. Previously, mixing of primary fluid flows with ambient fluid required either net mass injection into the flow or physical intrusion into the flow. These methods were not only marginally effective, but they were usually expensive to install or difficult to maintain as well. However, use of synthetic jet actuators in mixing of free flows avoids the need to physically intrude into the flow and gives the user better control of mixing through small scale vortex manipulation.

If a synthetic jet actuator is aligned perpendicular to a primary fluid flow and actuated at a very high frequency (typically around 5 kHz.), small scale mixing can be effectively controlled. Furthermore, through amplitude modulation, simultaneous excitation of both small and large scales is possible. Small scale manipulation can be effected by synthetic jet actuators where the scale of perturbations induced by the synthetic jet actuator is adjusted to be within the dissipation range of the affected flow. In fact, use of a synthetic jet actuator is not the only available method of perturbing the flow, but many methods of perturbation in a primary flow shear layer would yield similar results. While it is clear that direct excitation at the molecular scale is usually impractical with current technology, it is nonetheless possible to operate at the Kolmogorov scale or even considerably smaller. This enables one using some means of high frequency perturbation to induce mixing directly at the small scales without relying on the conventional energy cascade. This produces a vast improvement over the prior art in both control and effectiveness of mixing.

Additional advantages to this mixing enhancement technique are found in the fact that such high frequency excitation increases the dissipation of a primary flow's turbulent energy. That the resulting flow is more laminar than the corresponding unforced flow suggests that a reduction in turbulent drag may be expected if this technique is applied in a boundary layer. In addition, by sapping energy from the large eddies, this technique can be used to reduce noise caused by the impingement of a turbulent jet flow.

Excitation of the flow at frequencies corresponding to the Batchelor scale will increase scalar potential energy dissipation (molecular mixing of scalar quantities, such as concentration or temperature) in much the same manner as excitation at the Kolmogorov frequency increases turbulent kinetic energy dissipation. As scalar potential energy is reduced, scalar mixing is accomplished.

Additionally, small scale excitation is particularly advantageous in flows where it is not possible to create an effective energy cascade via large scale excitation. Examples include flows in highly viscous fluid or flows which occur on a very small scale. Furthermore, many flows in the chemical industry require mixing of flows saturated with or consisting entirely of very long polymers. In this case, it is possible to excite the flow at frequencies corresponding to the molecular scale itself.

Aligning a synthetic jet actuator perpendicular to the primary fluid flow is not the only way for a synthetic jet actuator to enhance mixing of the primary flow with ambient fluid. In some potential applications, such as mixing jet engine exhaust with ambient fluid in order to better cool the exhaust, it may be desirable to vector a primary jet as well as enhance mixing of the flow. If a synthetic jet actuator is placed parallel to the jet engine, not only will the jet be vectored toward the synthetic jet actuator (as described above) but the exhaust will also be more effectively mixed with the ambient fluid due to excitation of the large scale eddies in the flow. Vectoring with the much weaker synthetic jet actuator causes the primary jet to entrain much more ambient fluid into its stream. In fact, the primary jet flow rate can increase by 300° over the unvectored primary jet's flow rate. It is noteworthy that the difference in the flow rate between the forced and unforced primary jet flow is much larger than the flow rate of the synthetic control jet alone. Such entrainment of ambient fluid and the resultant mixing could easily help cool hot exhaust.

However, a more effective mixing apparatus is a configuration where one synthetic jet actuator is placed on the upper housing wall of a primary jet and another synthetic jet actuator is placed on the lower housing wall of the primary jet. All three jets are aligned to eject fluid in the same direction. Further, all three orifices are placed in or near the same exhaust plane. While the primary jet is operational, the two synthetic jet actuators may be turned on and off out of phase with one-another. Thus the primary jet flow is alternately pulled up and then pulled down by the vectoring action of the synthetic jet actuators. This results in an alternating "whipping" action of the primary jet flow. The resultant mixing of the primary jet flow with the ambient fluid is substantial due to quicker dispersion of the primary jet flow.

Finally, a synthetic jet actuator effecting the direction of another flow may be applied in industrial processes requiring that an object be coated with particles (or ions) suspended in a fluid. With the present technology, it is difficult to evenly coat an object which has long, narrow channels or crevices in its surface. Deposits of particles tend to be much thicker at the edges of the channel and very thin in the interior region of the channel. A synthetic jet actuator, on the other hand, could remedy this problem by causing fluid to flow down the walls of a channel quickly and thereby yield an even deposit of particles (or ions) along the channel walls.

In the preferred embodiment, a synthetic jet actuator could be placed at the bottom of a narrow channel in the object to be coated. When operational, the synthetic jet actuator at the bottom of the channel would produce a stream of fluid traveling up through the center of the channel. Because a synthetic jet actuator is zero net mass in nature, the fluid to fill the synthetic jet chamber must originate from the ambient fluid of the system in which the synthetic jet operates, but in order for fluid to reach the chamber of the synthetic jet actuator, it must travel down the channel and through the orifice. However, the synthetic jet is sending a stream of fluid up the center of the channel. Therefore, the fluid being drawn toward the chamber must quickly travel down the sides of the channel to reach the synthetic jet orifice. This process allows better coating of the channel walls than any method previously used.

Creation Of Fluid Flow In A Bounded Volume

In contrast to conventional jets, a unique feature of synthetic jet actuators is that they are synthesized from the working fluid of the flow system in which they are deployed. Therefore, synthetic jet actuators may be used to create fluid flows in bounded volumes, where conventional jets could never be used. In particular, synthetic jet actuators in bounded volumes are extremely effective in mixing the working fluid and in transporting heat away from solid surfaces in the bounded volume. Although equally true in open flow systems, one should be reminded that synthetic jet actuators in closed systems do not need any complex piping to function and do not inject any fluid into the system. This is not to mention the low energy requirements and the fact that other types of jets are, by their very nature, unusable in bounded volume situations due to their necessity of fluid injection.

By use of a synthetic jet actuator in a closed volume, control of mixing can be enhanced through small-scale vorticity manipulation and reduction of contamination will be effected through use of a jet which injects no foreign matter into the environment. The fluid flow created by the jet will greatly aid mixing of the fluids in the chamber without injecting any new matter into the chamber. Furthermore, use of a synthetic jet actuator will enable greater control of the mixing due to excitation at the Kolmogorov scale.

As mentioned above, another application of this technology is in using a synthetic jet actuator in a bounded volume to transfer heat in that volume. Cooling by natural convection is much less effective than is cooling with forced convection due to a fluid jet. However, a standard fluid jet requires a positive net mass injection into the system. A synthetic jet actuator, on the other hand, can be used in a bounded volume due to its ability to transfer momentum without any net mass transfer into the system.

A typical embodiment of a synthetic jet actuator used for cooling in a closed volume is a situation where one wall of an enclosure comprises an apparatus which emits heat as a by-product of functioning. As an example, this heat emitting apparatus could be a microchip array in a microcomputer. In this case, the synthetic jet actuator could be directed at the heat emitting apparatus. A stream of fluid impinging on the apparatus would be far more effective at cooling the apparatus than natural convection cooling.

Another specific application of this technology could involve a synthetic jet actuator aimed to flow along a heated surface, the flow being parallel to the heat producing body. Typically, this situation will involve a cyclical flow of the jet fluid about a heat sink surface. The heat sink surface may even protrude out of the sealed volume in which the jet is enclosed.

To summarize, there are many advantages to using a synthetic jet actuator to cool an object in a bounded volume. First, the object will be cooled more effectively by the forced convection that the synthetic jet allows than by natural convection. Also, the synthetic jet actuator will be very effective at cooling the surface without employing any complex piping and without injection of fluid into the system. Finally, very low power input is required to run a synthetic jet actuator relative to the power required for any other cooling system.

Micromachining Synthetic Jet Actuators

Application of synthetic jet interactions with other fluid flows or in bounded volumes may be accomplished by micro-scale synthetic jet actuators. In fact, many applications may require an unusually small apparatus. While normal jets may not be practical on such a small scale, because synthetic jet actuators draws so much of its power from another flow and is so simple in design, they are ideal for a micro-scale embodiment. Even though small in size, if used near another free flow, a synthetic jet actuator will draw power from the other flow. On the other hand, if the synthetic jet actuator is in a bounded volume, several synthetic jet actuators may be arrayed to build upon one another—a type of cascaded control.

Synthetic jet actuators may be micromachined to form microjet actuators, which can be used in macro flow control and other applications. The microjet actuators can be fabricated using standard silicon micromachining techniques and comprise an orifice situated atop an actuator cavity which is bounded by a flexible membrane. Vibration of the membrane using either electrostatic or piezoelectric drives results in a turbulent air jet formed normal to the microjet orifice. As in larger-scale geometries the jet is synthesized by a train of vortex rings. Each vortex is formed by the motion of the diaphragm and is advanced away from the jet under self-induced velocity. The vortices are formed at the excitation frequency and the jet is synthesized by their interaction with ambient fluid downstream from the orifice. As always, an important feature of the microjet actuator is that a fluid flow is formed without net mass injection.

While there is no question that one of the most important application areas for microactuators is the control of macro-events, these actuators (microjet actuators included) usually generate insufficient force to directly realize control authority. Thus, some type of mechanical amplification is required. An attractive means for the amplification of the actuator output is its coupling to inherently unstable pressure or flow systems. If system operating points are carefully chosen, the relatively small forces generated by a microactuator can be used to create large disturbances in either static, pressure-balanced systems or in free and wall-bounded shear flows. For example, in the area of jet thrust vectoring, millimeter-scale actuators can be used for thrust vectoring of larger jets having characteristic length scales that are at least two orders of magnitude larger. The energy necessary for manipulation is extracted from the vectored flow and thus the power input to the actuator is of the order of several milliwatts. Use of millimeter-scale zero net mass flux surface jets to control larger jets suggests the concept of cascaded control. Namely, that microjet actuators be used to manipulate millimeter-scale jets which, in turn, will control larger jets.

The use of microactuators for the control of macro-scale flows offers several advantages over conventional methods of flow control. For example, microactuators typically consume small amounts of power, and they can be integrated onto a chip with microsensors and control electronics. There are also the traditional micromachining advantages, such as high density batch fabrication for lower cost and improved reliability.

Additionally, whole arrays of microjet actuators may be desirable in some applications. Arrays of microjet actuators are particularly attractive for applications such as jet vectoring because they can be individually addressed and phased. The addressable microjet actuator array comprises an array of small orifices situated on top of an array of actuator cavities. Both the orifices and the cavities are batch fabricated from <100> silicon using micromachining techniques.

Individual jet control is achieved by use of a metallized flexible polyimide diaphragm. The metal electrodes on the diaphragm are patterned so that voltage can be individually applied to the region over each actuator cavity. A key feature of this design is that the diaphragm can be vibrated using either a commercial piezoelectric transducer to drive all array elements in parallel or a sinusoidal drive voltage applied to the flexible diaphragm of individual array elements. Driving the membrane in either fashion results in cavity pressure variations and a jet flow through the orifices. An individual jet is modulated by either reducing the amplitude of the drive voltage of an individual array element for electrostatic drive) or by electrostatically modulating the diaphragm vibration amplitude for that element (for piezoelectric drive).

Other features and advantages will become apparent to one with skill in the art upon examination of the following drawings and detailed description. All such additional features and advantages are intended to be included herein within the scope of the present invention, as is defined by the claims.

BRIEF DESCRIPTION OF THE DRAWINGS

The present invention can be better understood with reference to the following drawings. The drawings are not necessarily to scale, emphasis instead being placed upon clearly illustrating principles of the present invention. Moreover, like reference numerals designate corresponding parts throughout the several views.

FIG. 2E is a schematic cross-sectional side view of a second embodiment of a system for vectoring a primary jet with the synthetic jet actuator of FIG. 1A.

FIG. 3A is a schematic cross-sectional side view of the synthetic jet actuator of FIG. 1A in operation showing the direction of jet propulsion when the external surface surrounding the orifice is uniform.

FIG. 3B is a schematic cross-sectional side view of the synthetic jet actuator of FIG. 1A in operation with a wall the borders the orifice raised slightly in order to deform the external surface surrounding the orifice.

FIG. 3C is schematic cross-sectional side view of the synthetic jet actuator of FIG. 1A in operation with a small flap slightly raised in order to deform the external surface surrounding the orifice.

FIG. 4A is a schematic cross-sectional side view of an augmented synthetic jet vectoring system in operation, wherein the vectoring of the primary jet is augmented by deformation of the external surface surrounding the synthetic jet orifice.

FIG. 4B is a schematic cross-sectional side view of an augmented synthetic jet vectoring system in operation, wherein the vectoring of the primary jet is augmented by deployment of a small flap on the external surface directly above the synthetic jet orifice.

FIG. 4C is a schematic cross-sectional side view of an augmented synthetic jet vectoring system in operation, wherein the vectoring of the primary jet is augmented by deployment of a small flap on the external surface directly above the synthetic jet orifice and by deformation of the external surface surrounding the synthetic jet orifice.

FIG. 13 is a schematic cross-sectional side view of a microjet actuator fabricated with a novel micromachining process of the present invention.

FIG. 14A is a schematic cross-sectional side view of a partially fabricated microjet actuator of FIG. 13 prior to a step in the micromachining process of etching the orifice in the silicon wafer.

FIG. 14B is a schematic cross-sectional side view of a partially fabricated microjet actuator of FIG. 13 after a step in the micromachining process of etching the orifice in the silicon wafer.

FIG. 14C is a schematic cross-sectional side view of a partially fabricated microjet actuator of FIG. 13 prior to a step in the micromachining process of etching the actuator cavity in the bottom side of the silicon wafer.

FIG. 14D is a schematic cross-sectional side view of a partially fabricated microjet actuator of FIG. 13 after a step in the micromachining process of etching the actuator cavity in the silicon wafer.

FIG. 14E is a schematic cross-sectional side view of a partially fabricated microjet actuator of FIG. 13 after steps in the micromachining process of attaching the diaphragm and metallizing the diaphragm.

FIG. 15A is a schematic cross-sectional side view of a microjet actuator array with a hybrid microjet actuator assembly.

FIG. 15B is a schematic cross-sectional side view of a microjet actuator array with an integrated polyimide diaphragm produced in accordance with a novel micromachining process of the present invention.

FIG. 16A is a schematic cross-sectional side view of a partially fabricated microjet actuator of FIG. 15B after a step in the micromachining process of anisotropic etching the actuator cavity.

FIG. 16B is a schematic cross-sectional side view of a partially fabricated microjet actuator of FIG. 15B after a step in the micromachining process of electroplating the cavity with nickel.

FIG. 16C is a schematic cross-sectional side view of a partially fabricated microjet actuator of FIG. 15B after steps in the micromachining process of attaching the polyimide diaphragm and of etching the orifice in the silicon wafer.

FIG. 16D is a schematic cross-sectional side view of a partially fabricated microjet actuator of FIG. 15B after the steps in the micromachining process of removing the electroplated nickel from the actuator cavity and depositing an aluminum electrode over the diaphragm.

DETAILED DESCRIPTION OF THE PREFERRED EMBODIMENTS

It will be obvious to those skilled in the art that many modifications and variations may be made to the preferred embodiments of the present invention as described hereafter without substantially departing from the spirit and scope of the present invention. All such modifications and variations are intended to be included herein within the scope of the present invention, as is set forth in the appended claims.

I. Synthetic Jet Actuator

Figure 1A:
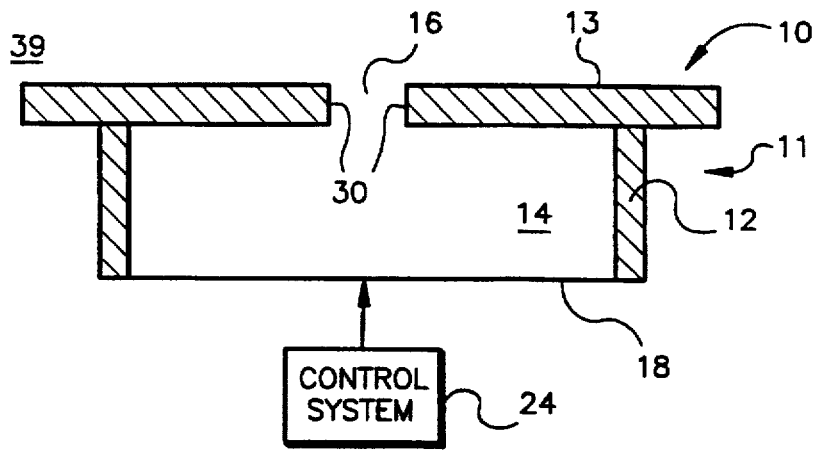
FIG. 1A is a schematic cross-sectional side view of a zero net mass flux synthetic jet actuator with a control system.

FIG. 1A depicts a synthetic jet actuator 10 comprising a housing 12 defining and enclosing an internal chamber 14. The housing 12 and chamber 14 can take virtually any geometric configuration, but for purposes of discussion and understanding, the housing 12 is shown in cross-section in FIG. 1A to have a rigid side wall 12, a rigid front wall 13, and a rear diaphragm 18 that is flexible to an extent to permit movement of the diaphragm 18 inwardly and outwardly relative to the chamber 14. The front wall 13 has an orifice 16 of any geometric shape. The orifice diametrically opposes the rear diaphragm 18 and connects the internal chamber 14 to an external environment having ambient fluid 39.

The flexible diaphragm 18 may be controlled to move by any suitable control system 24. For example, the diaphragm 18 may be equipped with a metal layer, and a metal electrode may be disposed adjacent to but spaced from the metal layer so that the diaphragm 18 can be moved via an electrical bias imposed between the electrode and the metal layer. Moreover, the generation of the electrical bias can be controlled by any suitable device, for example but not limited to, a computer, processor, logic, or signal generator. The control system 24 can cause the diaphragm 18 to move periodically, or modulate in time-harmonic motion, and force fluid in and out of the orifice 30.

Figure 1B:
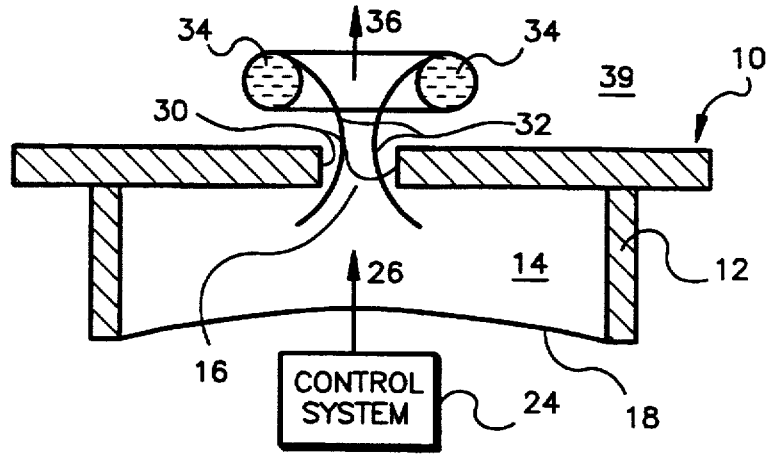
FIG. 1B is a schematic cross-sectional side view of the synthetic jet actuator of FIG. 1A depicting the jet as the control system causes the diaphragm to travel inward, toward the orifice.

The operation of the synthetic jet actuator 10 will now be described with reference to FIGS. 1B and 1C. FIG. 1B depicts the synthetic jet actuator 10 as the diaphragm 18 is controlled to move inward into the chamber 14, as depicted by arrow 26. The chamber 14 has its volume decreased and fluid is ejected through the orifice 16. As the fluid exits the chamber 14 through the orifice 16, the flow separates at the sharp orifice edges 30 and creates vortex sheets 32 which roll into vortices 34 and begin to move away from the orifice edges 30 in the direction indicated by arrow 36.

Figure 1C:
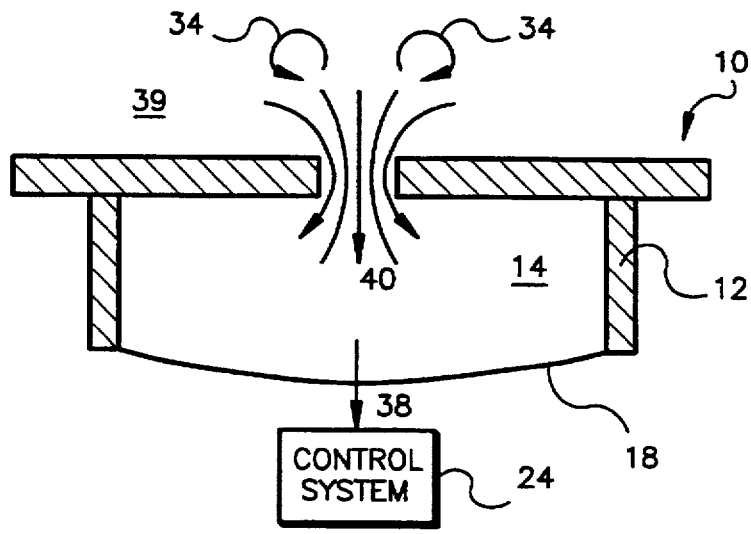
FIG. 1C is a schematic cross-sectional side view of the synthetic jet actuator of FIG. 1A depicting the jet as the control system causes the diaphragm to travel outward, away from the orifice.

FIG. 1C depicts the synthetic jet actuator 10 as the diaphragm 18 is controlled to move outward with respect to the chamber 14, as depicted by arrow 38. The chamber 14 has its volume increased and ambient fluid 39 rushes into the chamber 14 as depicted by arrow 40. The diaphragm 18 is controlled by the control system 24 so that when the diaphragm 18 moves away from the chamber 14, the vortices 34 are already removed from the orifice edges 30 and thus are not affected by the ambient fluid 39 being drawn into the 14. Meanwhile, a jet of ambient fluid 39 is synthesized by the vortices 34 creating strong entrainment of ambient fluid drawn from large distances away from the orifice 16.

Such a synthetic jet actuator can be used to great advantage with either another fluid stream or in a bounded volume. First, embodiments involving interaction with another fluid stream will be described.

II. Synthetic Jet Actuator Interacting With Another Fluid Stream

Figure 2A:
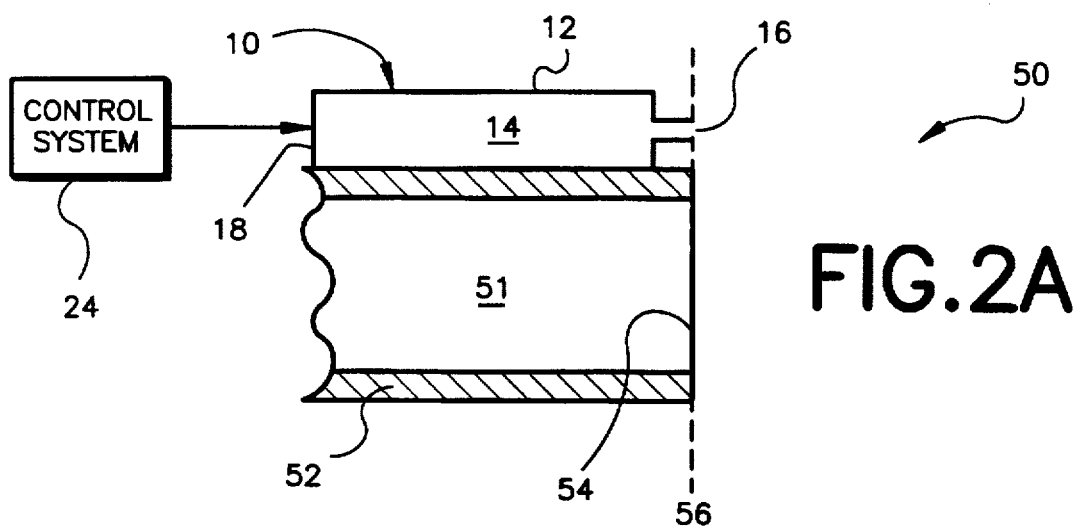
FIG. 2A is a schematic cross-sectional side view of a first embodiment of a system for vectoring a primary jet with the synthetic jet actuator of FIG. 1A.

A. Use Of A Synthetic Jet Actuator To Vector Fluid Flow From Another Jet Actuator The synthetic jet actuator 10 is particularly effective at controlling the direction of, or vectoring, the flow of fluid projected from another jet, whether the other jet is a synthetic jet or a conventional jet. FIG. 2A depicts one possible configuration of a jet vectoring system 50. The synthetic jet actuator 10 and a primary jet 51 are used in the jet vectoring system 50. As described above, the synthetic jet actuator 10 generally comprises a housing 12 defining a chamber 14. The chamber 14 is bounded on one end by a flexible diaphragm 18, and the housing 12 has an orifice 16 therein. The diaphragm 18 is caused to oscillate by a control system 24 so that a synthetic jet stream is propagated from the orifice 16.

The primary jet actuator 51 is comprised of a housing 52 and a means for expelling fluid out of the primary jet exit 54. A particular example of such a primary jet actuator 51 could be a jet engine or other fluid emitting device. The control synthetic jet actuator 10 is disposed on the top surface of the primary jet housing 52. The control synthetic jet actuator 10 is positioned such that the synthetic control jet orifice 16 and the primary jet exit 54 are in approximately the same plane (primary jet exhaust plane), as depicted by broken line 56.

Figure 2B:
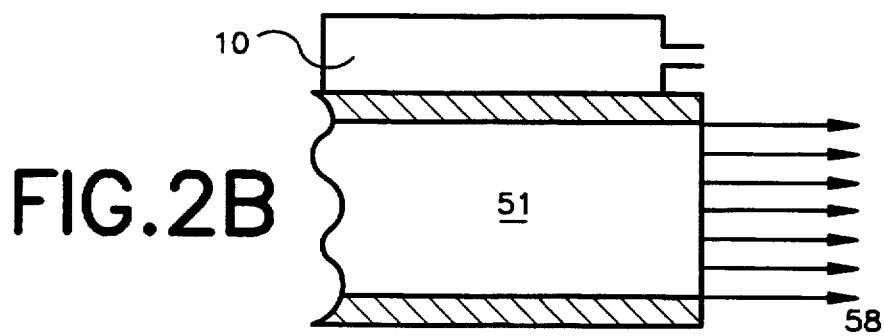
FIG. 2B is a schematic cross-sectional side view of the system of FIG. 2A with only the primary jet being operational.

In FIG. 2B, the primary jet actuator 51 is operating unforced, that is, with the control synthetic jet actuator 10 not operational. The fluid emitted by the primary jet actuator 51 is depicted by the set of arrows 58. The expulsion of fluid, as depicted by arrows 58, occurs generally normal to the exhaust plane 56 of the primary jet actuator 51.

Figure 2C:
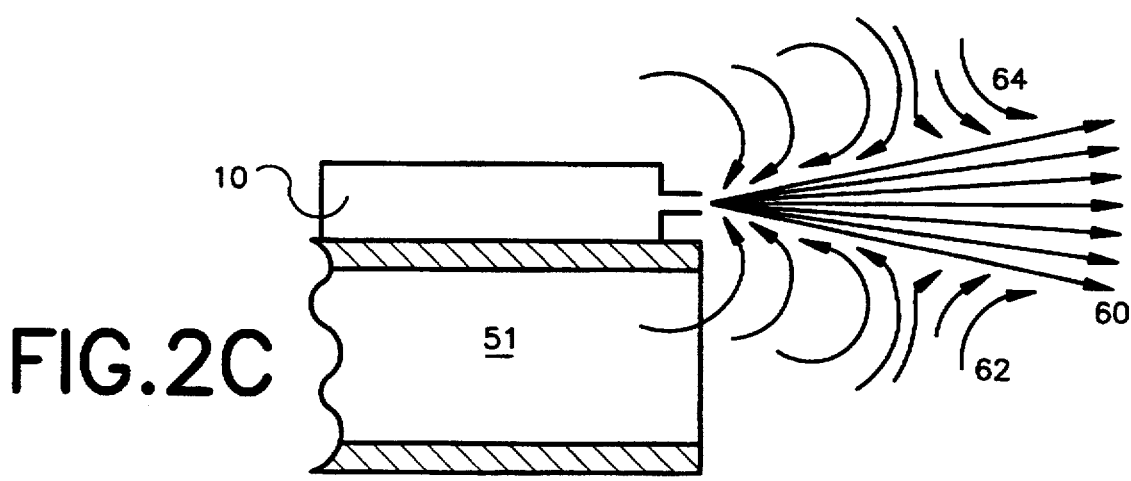
FIG. 2C is a schematic cross-sectional side view of the system of FIG. 2A with only the synthetic control jet being operational.

In FIG. 2C, the control synthetic jet actuator 10 is depicted operating with the primary jet actuator 51 not operational. The set of arrows 60 represent the streamlines of fluid flowing from the control synthetic jet actuator 10. Two sets of arrows 62, 64, represent the ambient fluid being entrained into the synthetic jet stream 60 from the control synthetic jet actuator 10.

Figure 2D:
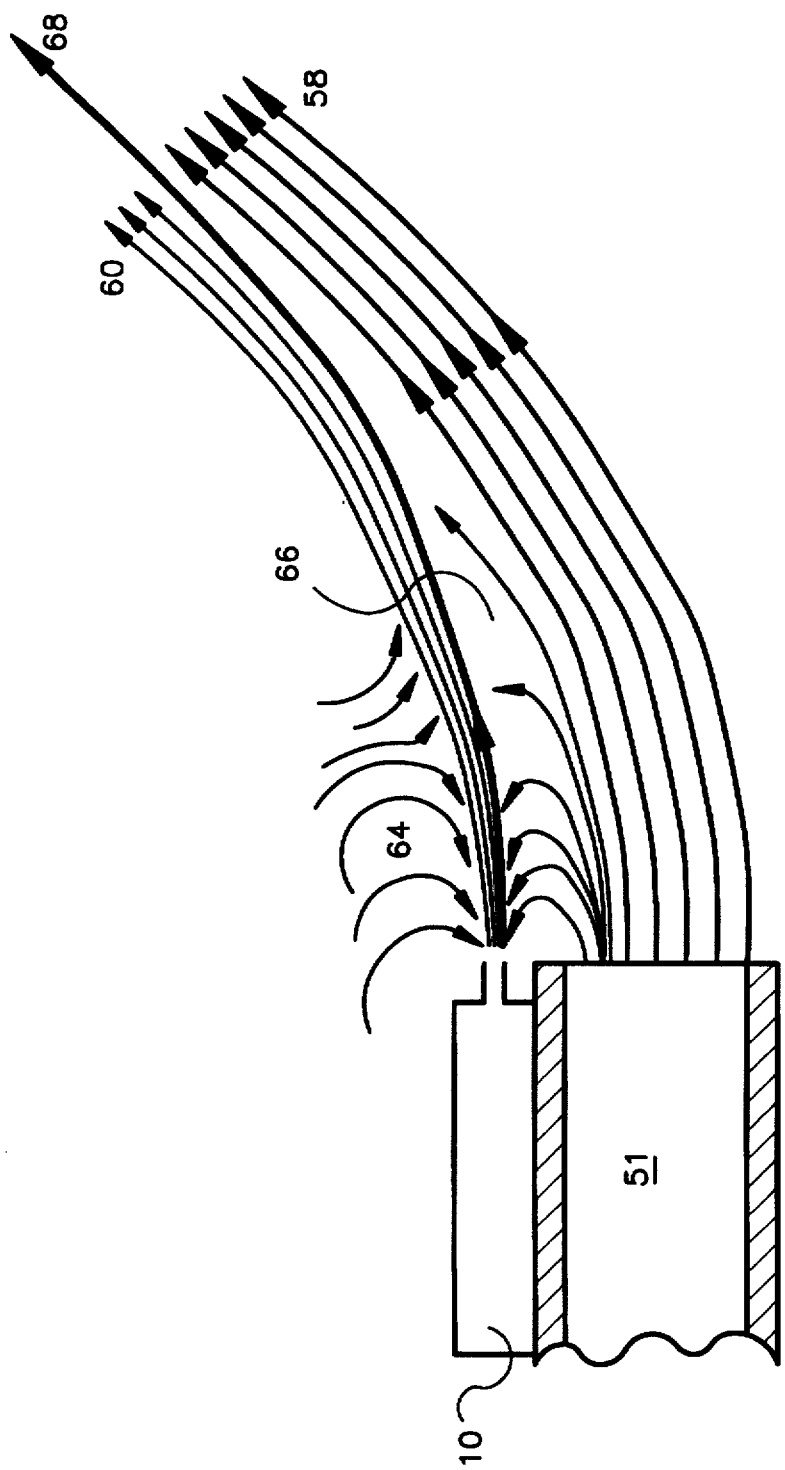
FIG. 2D is a schematic cross-sectional side view of the system of FIG. 2A with both the primary jet and the synthetic control jet being operational.

FIG. 2D shows the results when both the control synthetic jet actuator 10 and the primary jet actuator 51 are operational at the same time while in the previously described configuration 50. When the synthetic control jet flow 60 is allowed to interact with the primary jet flow 58, the control synthetic jet actuator 10 draws some of the primary jet flow 58 into the synthetic control jet orifice 16, resulting in an intense low pressure region 66 between the synthetic control jet orifice 16 and the primary jet exit 54. Due to this low pressure region 66, the primary jet flow 58 is vectored upward, i.e., toward the control synthetic jet actuator 10.

To achieve the vectoring of the primary jet flow 58 upward, the synthetic control jet orifice 16 and the primary jet exit 54 should be disposed in approximately the same exhaust plane 56. If the entire control synthetic jet actuator 10 is moved along the top housing 52 of the primary jet actuator 51 away from the primary jet exhaust plane 56, as depicted in FIG. 2E, then the effect of the control synthetic jet actuator 10 on the primary jet flow 58 changes dramatically.

The effect of the synthetic jet actuator 10 on the primary jet flow 58 when the control synthetic jet actuator is moved backward as described is depicted in FIG. 2E. Once the control synthetic jet actuator 10 is moved to greater than a certain distance behind the primary jet exhaust plane 56, the synthetic jet flow 60 will attach to the primary jet housing 52, upon which it is mounted, due to the Coanda effect. However, this attachment is stronger than ordinary Coanda effect, owing to fluid sucked out of a recirculation bubble 67, rather than relying on entrainment into the synthetic jet actuator 10 to cause a low pressure region 69 to form near the synthetic jet orifice 16.

In the configuration depicted in FIG. 2E, when the synthetic jet orifice 16 is a certain distance behind the primary jet exit plane 56, the synthetic jet flow 60 will negotiate the 90-degree turn 70 at the end of the primary jet housing 52. The synthetic jet flow 60 will then impinge on the primary jet flow 69 and cause the primary jet flow 58 to be vectored downward, away from the control synthetic jet actuator 10, as shown in FIG. 2E.

Therefore, a primary jet actuator 51 may be vectored either upward or downward by a control synthetic jet actuator 10 of far lesser strength by merely moving the control synthetic jet actuator 10 forward or backward along the primary jet housing 52. This gives an operator a means of quickly and easily changing the path of the primary jet flow 58, if desired.

As a result of the strong entrainment of ambient fluid induced by the synthetic jet actuator 10, such a jet 10 can be made to dynamically vector itself. This is accomplished by alteration of the external surface surrounding the orifice near the jet exit plane to achieve a Coanda effect on the synthetic jet stream.

FIG. 3A depicts the outer flow streamlines 72 of a synthetic jet actuator 10, while the synthetic jet actuator 10 is in operation. The external surface surrounding the orifice 16 is undistorted and hence the overall fluid flow, as depicted by arrow 74, out of the synthetic jet orifice 16 is substantially normal to the upper synthetic jet housing walls 76a, 76b and parallel to an axis symmetric about the midline of the orifice 16.

FIG. 3B depicts a configuration where the synthetic jet actuator 10 has its housing wall 76a on the right side of the jet orifice 16 raised with respect to the wall 76b on the left side of the jet orifice 16. This configuration results in an irregular, or nonuniform, external surface about the orifice 16. Entrainment of fluid into the jet orifice 16 and into the fluid stream 74 is retarded on the right side of the jet. Therefore, the synthetic jet flow 74 is vectored to the right, i.e., toward the raised housing wall 76a, by this adjustment to the housing wall 76a of the synthetic jet actuator 10.

FIG. 3C depicts another method of distorting the flow of the synthetic stream from the orifice 16. A flap 78 that is normally flat against the jet housing wall 76a is raised to some angle φ. The flap 78 retards entrainment of fluid only on one side of the orifice 16 just as raising the right wall 76a did. Therefore, the synthetic jet flow 74 is vectored toward the side of the orifice 16 where the flap 78 is deployed. The outermost streamlines 72 of the synthetic jet flow 74 are shown in FIG. 3C to demonstrate the extent of the vectoring caused by deploying the flap 78.

The ability of the synthetic jet to self-vector, as just demonstrated, can be used to enhance the vectoring effect that a synthetic jet actuator 10 will have on a fluid flow from a primary jet actuator.

FIG. 4A depicts a possible configuration of an augmented jet vectoring system 79. Only a control synthetic jet actuator 10 and a primary jet actuator 51 are used in the system 79. The control synthetic jet actuator 10 is generally comprised of the elements as described above. The primary jet actuator 51 is comprised of a housing 52 and a means of expelling fluid out of the primary jet exit 54. The control synthetic jet actuator 10 is disposed on the top side of the primary jet housing 52. The control synthetic jet actuator 10 is positioned such that the synthetic control jet orifice 16 and the primary jet exit 54 are in approximately the same exhaust plane 56. Note that the synthetic control jet orifice 16 is formed by upper wall 76a and lower wall 76b.

In the above described system 79, the external surface about the synthetic control jet orifice 16 can be modified by moving wall 76b toward the back of the control synthetic jet actuator 10, as shown in FIG. 4A. This deformation will cause the synthetic control jet flow 60, when acting alone, to self-vector away from the primary jet actuator 51. When the control synthetic jet actuator 10 and the primary jet actuator 51 are allowed to operate at the same time, the vectoring of the primary jet flow 58 caused by the synthetic control jet flow 60 will be enhanced and the primary jet flow 58 will be vectored at a greater angle upward than if the synthetic control jet orifice 16 were undeformed, as shown in FIG. 4A.

FIG. 4B depicts a control synthetic jet actuator 10 and a primary jet actuator 51 in generally the same configuration 79 as in FIG. 4A. However, in the system 79' of FIG. 4B, instead of the wall 76b of the control synthetic jet actuator 10 being moved to deform the synthetic jet orifice 16, a flap 78 on the upper wall 76a is deployed. Similar to the moving of the lower front wall 76b, deployment of this flap 78 will greatly enhance the vectoring of the primary jet flow 58 when the synthetic control jet flow 60 interacts with the primary jet flow 58. This result is shown in FIG. 4B.

FIG. 4C depicts basically the same augmented control configuration 80 of a control synthetic jet actuator 10 and a primary jet actuator 51. However, in the system 79" of FIG. 4C, not only is a flap 78 deployed on the upper frontal wall 76a, but also the lower frontal wall 76b is moved backward. Use of both means of deformation of the orifice external surface will have even a greater impact on the path of the synthetic jet flow 60. Consequently, the effect the synthetic jet flow 60 has on the primary jet flow 58 will be even greater than if only one means of deforming the external surface about the orifice 16 were utilized.

B. Aerodynamic Surface Modification

A synthetic jet actuator 10 may be placed in many different solid bodies in fluid flows in order to effectively alter the apparent aerodynamic shape of that solid body. The particular body could be either a bluff body in a flow or possibly an aerodynamic lifting surface.

Figure 5A:
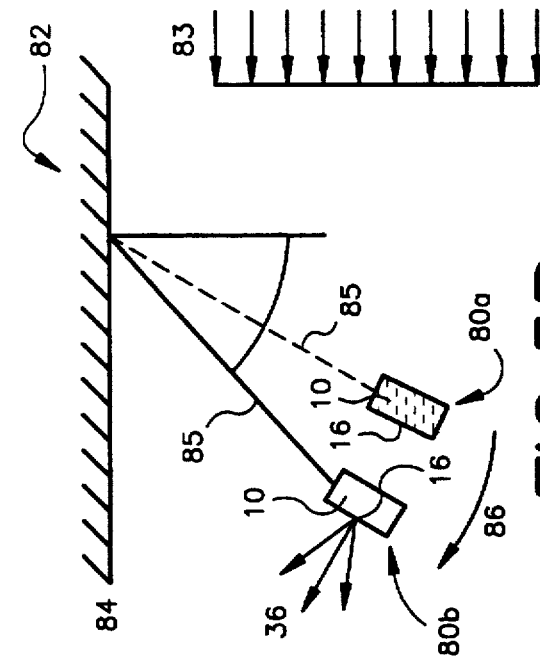
FIG. 5A is a schematic cross-sectional side view of a synthetic jet actuator embedded in a cylindrical section.

An embodiment of a synthetic jet actuator 10 modifying flow about a bluff body, though not limited to this embodiment, is depicted in FIG. 5A. FIG. 5A shows a side cut away view of a synthetic jet actuator 10 imbedded in a cylindrical section 80. In the preferred embodiment, the walls of the cylindrical section 80 define the internal chamber 14 of the synthetic jet actuator 10. The right flat wall 18 of said cylindrical section 80 is constructed of a flexible material such that the wall 18 comprises the synthetic jet actuator diaphragm 18. In the left flat wall 81 of the cylindrical section 80, there is a small hole 16, of circular shape, comprising the synthetic jet actuator orifice 16.

Figure 5B:
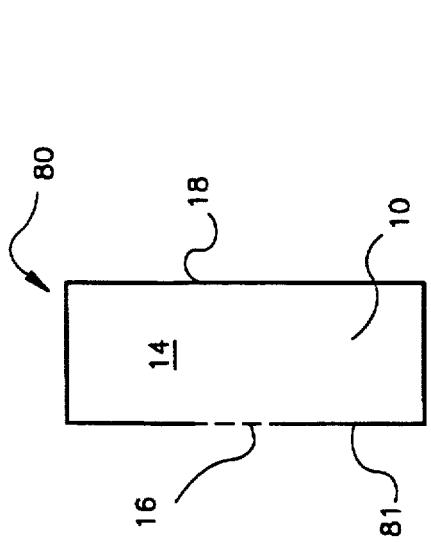
FIG. 5B is a schematic cross-sectional side view of the device in FIG. 5A mounted in a wind tunnel to show the aerodynamic effect of the synthetic jet actuator on the cylindrical section when the synthetic jet is aligned to create a flow in the same direction as the primary flow.

FIG. 5B is a schematic depiction of a test assembly (generally denoted as 82) which could be used to demonstrate modification of the aerodynamic forces on a cylindrical section (depicted by 80a and 80b) due to operation of a synthetic jet actuator 10. The shaded depiction of the cylindrical section 80a shows the position of the cylindrical section 80a with the synthetic jet actuator 10 not operational. Alternatively, the unshaded drawing of the cylindrical section 80b shows the position of the cylindrical section 80b with the synthetic jet actuator 10 activated.

In this test assembly 82, the cylindrical section 80a is submerged in a fluid stream (depicted by arrows 83) while suspended from an upper surface 84 by a wire 85. The cylindrical section 80a is positioned such that the synthetic jet orifice 16 is in the left face 81 of the cylindrical section 80a. When the synthetic jet actuator 10 is activated, the unshaded cylindrical section 80b depicts the new position of the cylindrical section 80b. The synthetic jet actuator 10 causes a fluid stream (depicted by arrows 36) to emanate from the jet orifice 16. The fluid stream 36 created by the synthetic jet actuator 10 causes the aerodynamic forces operating on the cylindrical section 80b to change from the forces acting on the cylindrical section 80a without the synthetic jet operating. This change in forces is the reason the cylindrical section 80a swings left-ward as indicated by arrow 86 to a new position, indicated by the unshaded cylindrical section 80b.

Figure 5C:
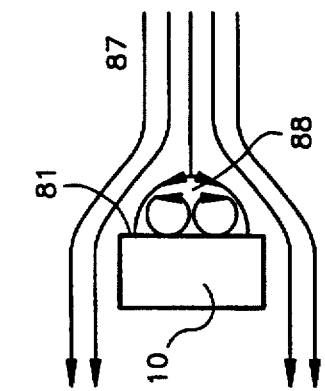
FIG. 5C is also a schematic cross-sectional side view of the device in FIG. 5A mounted in a wind tunnel to show the aerodynamic effect of the synthetic jet actuator on the cylindrical section, however in this depiction, the synthetic jet is aligned to create a flow in the opposite direction as the primary flow.

FIG. 5C depicts the same test assembly 82 as in FIG. 5B except the synthetic jet actuator orifice 16 in the cylindrical section wall 81 now faces the fluid flow 83. The shaded cylindrical section 80a depicts the position of the section 80a with the synthetic jet actuator 10 turned off and the unshaded cylindrical section 80b depicts the position of the section 80b with the synthetic jet 10 operational. When the synthetic jet actuator 10 is activated, a fluid stream 36 emanates from the jet orifice 16 and the cylindrical section (depicted by 80b after activation of the synthetic jet actuator 10) swings toward the fluid flow 83 as depicted by arrow 86'.

Figure 5D:
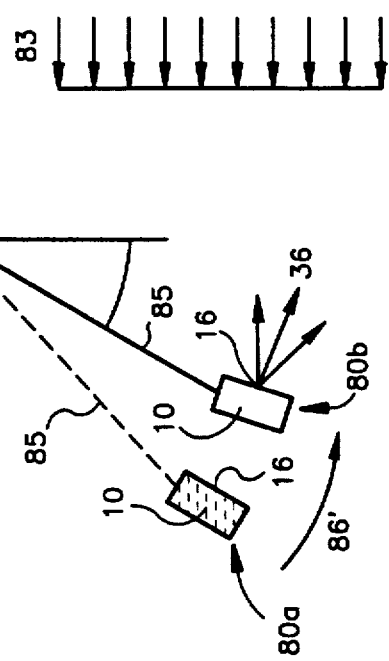
FIG. 5D is a schematic cross-sectional view of fluid flow around a cylindrical section with an operational synthetic jet actuator embedded therein.

The movement of a cylindrical section 80 placed in said test assembly 82 can best be explained by reference to FIG. 5D. In FIG. 5D, the cylindrical section 80 is depicted in a flow (with streamlines 87) with the synthetic jet actuator 10 operational. The synthetic jet actuator 10 creates a permanent recirculation region 88 on the cylindrical section wall 81. Such alteration of the apparent aerodynamic shape of the cylindrical section 80, produces a low pressure region along the cylindrical section surface 81. This redirection of the fluid flow (depicted by the streamlines 87) about the cylindrical section 80, and resulting low pressure region 88, cause the motion of the cylindrical section 80 as depicted above in FIG. 5B and FIG. 5C.

A preferred embodiment of a synthetic jet actuator embedded in a non-bluff body, though applications of this concept are not limited to this embodiment, is the use of a synthetic jet actuator 10 as means for the modification of lift and drag characteristics of an aerodynamic surface by interacting with the free stream flow across the surface.

Figure 6A:
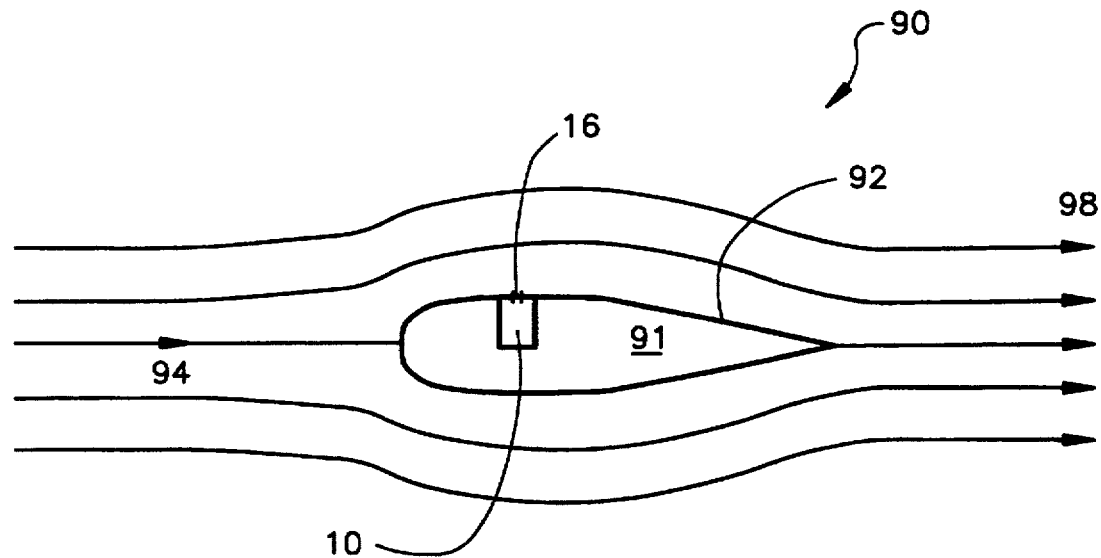
FIG. 6A is a schematic cross-sectional side view of a wing with the synthetic jet actuator of FIG. 1A embedded in the wing.

FIG. 6A depicts the preferred embodiment 90 of a synthetic jet actuator 10 used to modify the lift and drag characteristics of an aerodynamic surface 91. In this embodiment 90, a synthetic jet actuator 10 is embedded in an airfoil 91 such that the synthetic jet orifice 16 is flush with the external surface, or skin, of the airfoil 92. The airfoil 91 is then placed in a free stream of fluid, as depicted by the arrow 94. The flow of the fluid 94 about the airfoil 91 is depicted by the set of streamlines 98. As depicted, the airfoil 91 is at zero degrees angle of attack, and the airfoil 91 is symmetric about its chord line.

Figure 6B:
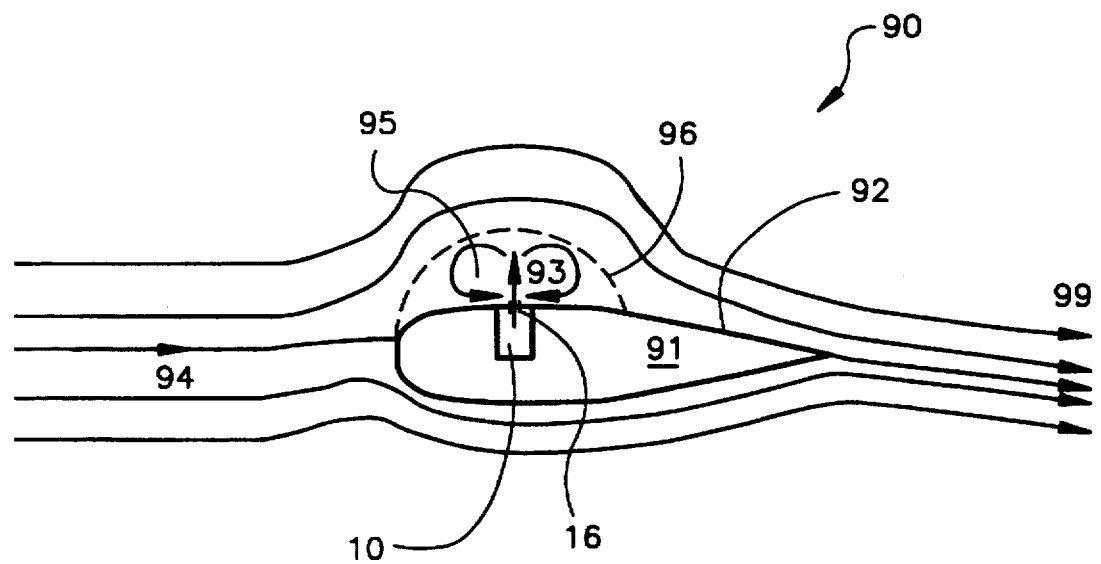
FIG. 6B is a schematic cross-sectional side view of the wing of FIG. 6A in operation showing the modification of fluid flow resulting from the synthetic jet actuator of FIG. 1A.

FIG. 6B shows the embodiment 90 when the synthetic jet actuator 10 is operational. When the synthetic jet actuator 10 is operational, the synthetic jet actuator 10 forms a fluid flow as depicted by arrow 93 normal to the synthetic jet orifice 16 in the airfoil skin 92. Because the synthetic jet actuator 10 does not inject any new fluid into the free stream flow 94, a closed recirculating flow region 95 is formed adjacent to the airfoil skin 92. This region 95 is depicted in FIG. 6B as bounded by the broken line 96. Because this recirculating region 95 is closed, the aerodynamic shape of the airfoil surface 92 is effectively modified. The new effective shape is depicted by the airfoil skin 92 with the addition of the broken line 96, representing the closed region of flow 95. Because of the airfoil surface modification, the streamlines 99 of the free stream flow 94 will flow over the recirculating region 95, defined by the broken line 96, just as if the broken line 96 were a solid part of the airfoil skin 92. Thus, the aerodynamic characteristics of the airfoil 91 are changed by operation of the synthetic jet actuator 10.

C. Free Stream Mixing

Figure 7A:
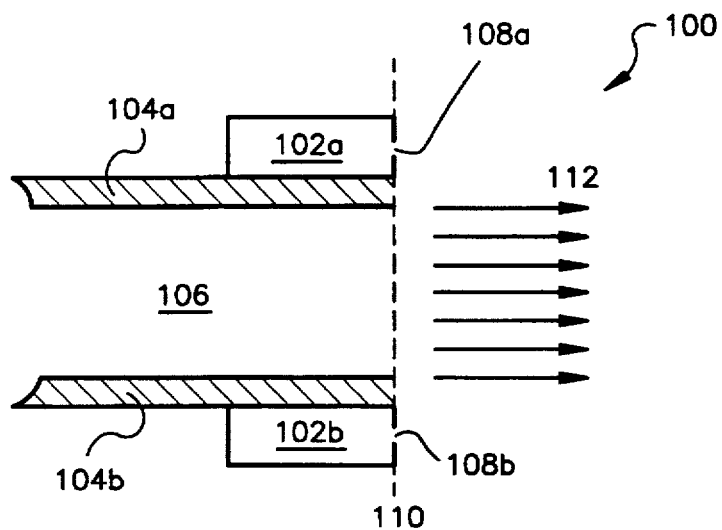
FIG. 7A is a schematic cross-sectional side view of a synthetic jet mixing system for use in mixing fluids.

The preferred embodiment for using a synthetic jet actuator to mix another jet of fluid with ambient fluid through large scale vorticity manipulation is pictured in FIG. 7A, denoted by reference numeral 100. Here, a synthetic jet actuator 102a is attached to the upper housing wall 104a of a primary jet actuator 106 and another synthetic jet actuator 102b is attached to the lower housing wall 104b of the primary jet actuator 106. Both the orifice 108a of the top synthetic jet actuator 102a and the orifice 108b of the bottom synthetic jet actuator 102b are placed in the exhaust plane 110 of the primary jet actuator 106.

Figure 7B:
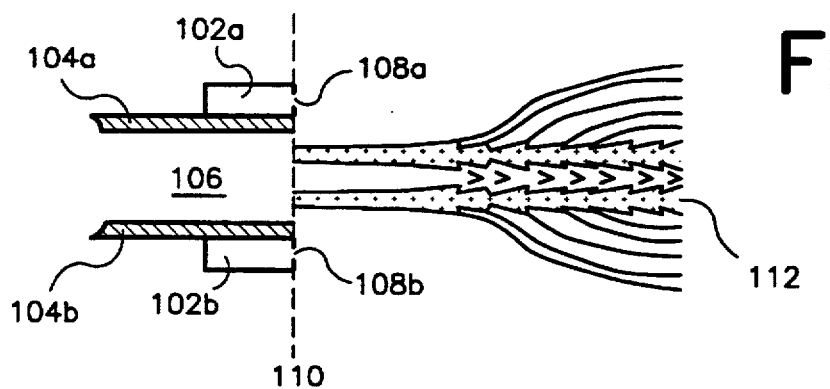
FIG. 7B is a schematic cross-sectional side view of the synthetic jet mixing system of FIG. 7A showing only a primary jet of fluid in operation.
Figure 7C:
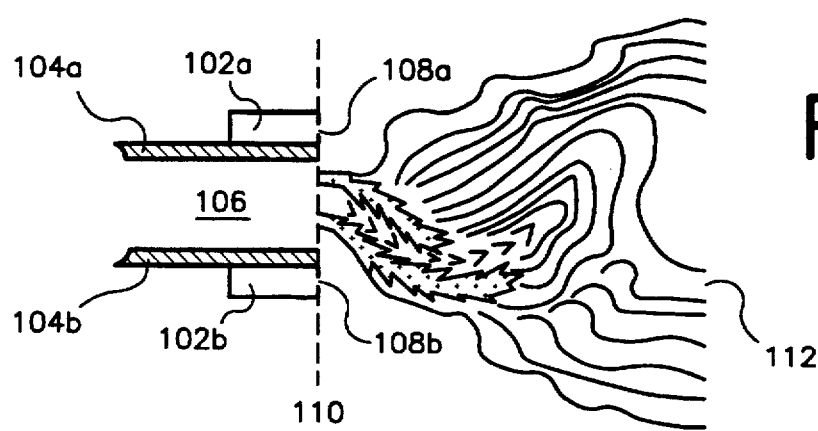
FIG. 7C is a schematic cross-sectional side view of the synthetic jet mixing system of FIG. 7A showing full operation and the alternating whipping motion of the primary jet caused by the two synthetic jet actuators.

FIG. 7B depicts the system 100 with only the primary jet actuator 106 operational. FIG. 7C shows the system 100 when fully operational. In operation as shown in FIG. 7C, while the primary jet actuator 106 is operational, the two synthetic jets 102a, 102b are alternately turned on and off out of phase with one another. Thus, the primary jet flow 112 is alternately pulled upward and then pulled downward by the vectoring action (as described earlier) of first the top synthetic jet actuator 102a and then the bottom synthetic jet actuator 102b. The interaction of the three jets results in an alternating "whipping" motion of the primary jet flow 112, as depicted in FIG. 7C.

Figure 8:
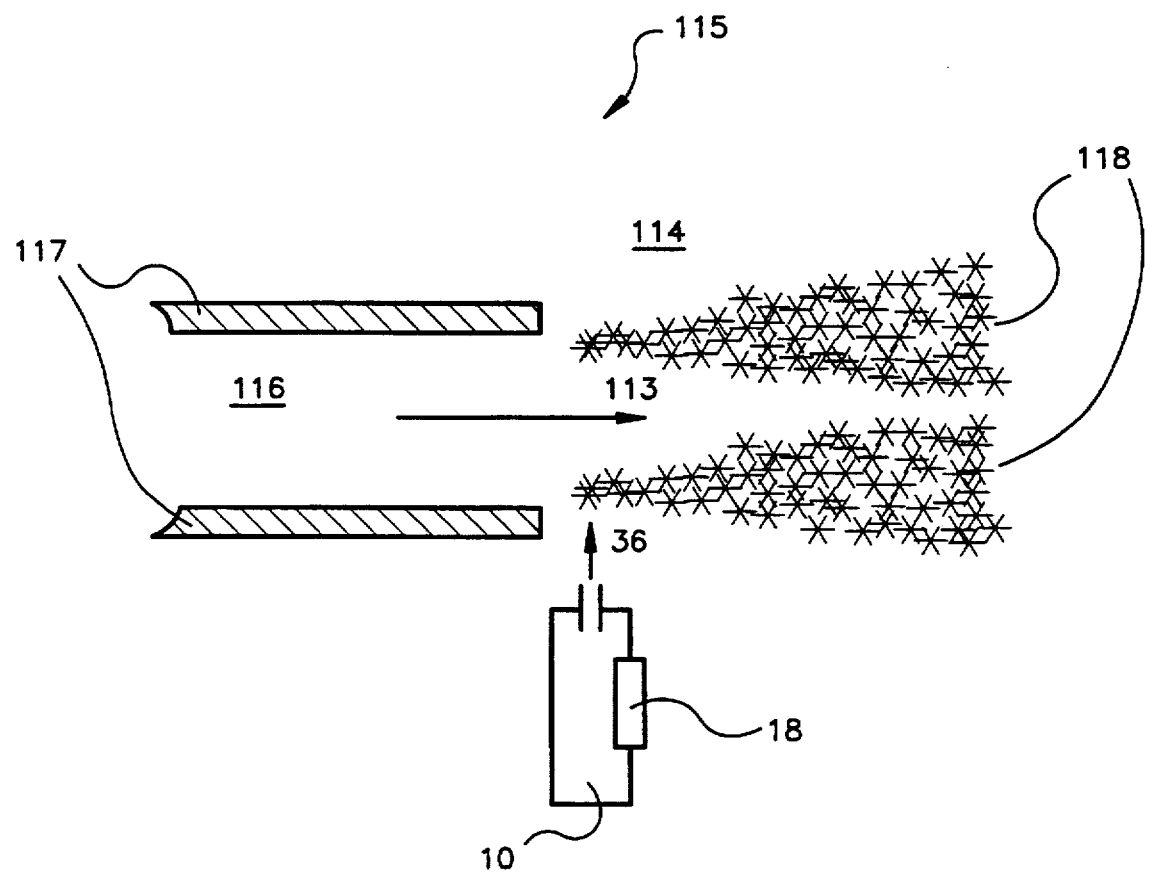
FIG. 8 is a schematic cross-sectional side view of a synthetic jet actuator mounted transverse to a primary jet to directly excite high frequency dissipative motions.

The preferred embodiment for using a synthetic jet actuator 10 to mix a primary jet of fluid 113 with ambient fluid 114 through direct small scale vorticity manipulation is pictured in FIG. 8, denoted by reference numeral 115. Although any means of high frequency excitation would yield the same basic results, use of a synthetic jet actuator 10 is depicted here.

High frequency excitation can be effected by a number of actuators including fluidic actuators, synthetic jets, or piezoelectric actuators where the scale of the perturbations induced by the actuator is adjusted to be within the dissipation range of the flow. Conventional pulsed jets, moving flaps, and electromechanical actuators (such as speakers) can also be used to introduce the high frequency, high amplitude disturbances required locally. Ultrasonic devices can introduce even higher frequencies, to excite the flow at scales which approach the length of long polymers. Magnetohydrodynamic actuation can be used to nonintrusively introduce dissipative motions globally throughout the flow. It should be noted that with any of these techniques, it is possible to operate at the Kolmogorov scale, the Batchelor scale, or even considerably smaller.

In the preferred embodiment shown in FIG. 8, a square primary jet 116 is shown with a synthetic jet actuator 10 situated such that its flow direction (depicted by arrow 36) is perpendicular to the flow direction (depicted by arrow 113) of the primary jet 116. As the primary jet flow 113 passes out of the primary jet housing 117, a shear layer 118 is formed between the high speed jet fluid 113 and the ambient fluid 114. This shear layer 118 is filled with turbulent flow. The synthetic jet actuator 10 is then activated and operated by vibration of the synthetic jet actuator diaphragm 18 at a very high frequency. Such high frequency excitation increases the dissipation of the primary jet turbulent energy and scalar potential energy at a faster rate than if no synthetic jet actuator 10 were used.

D. Flow into a Channel

Figure 9:
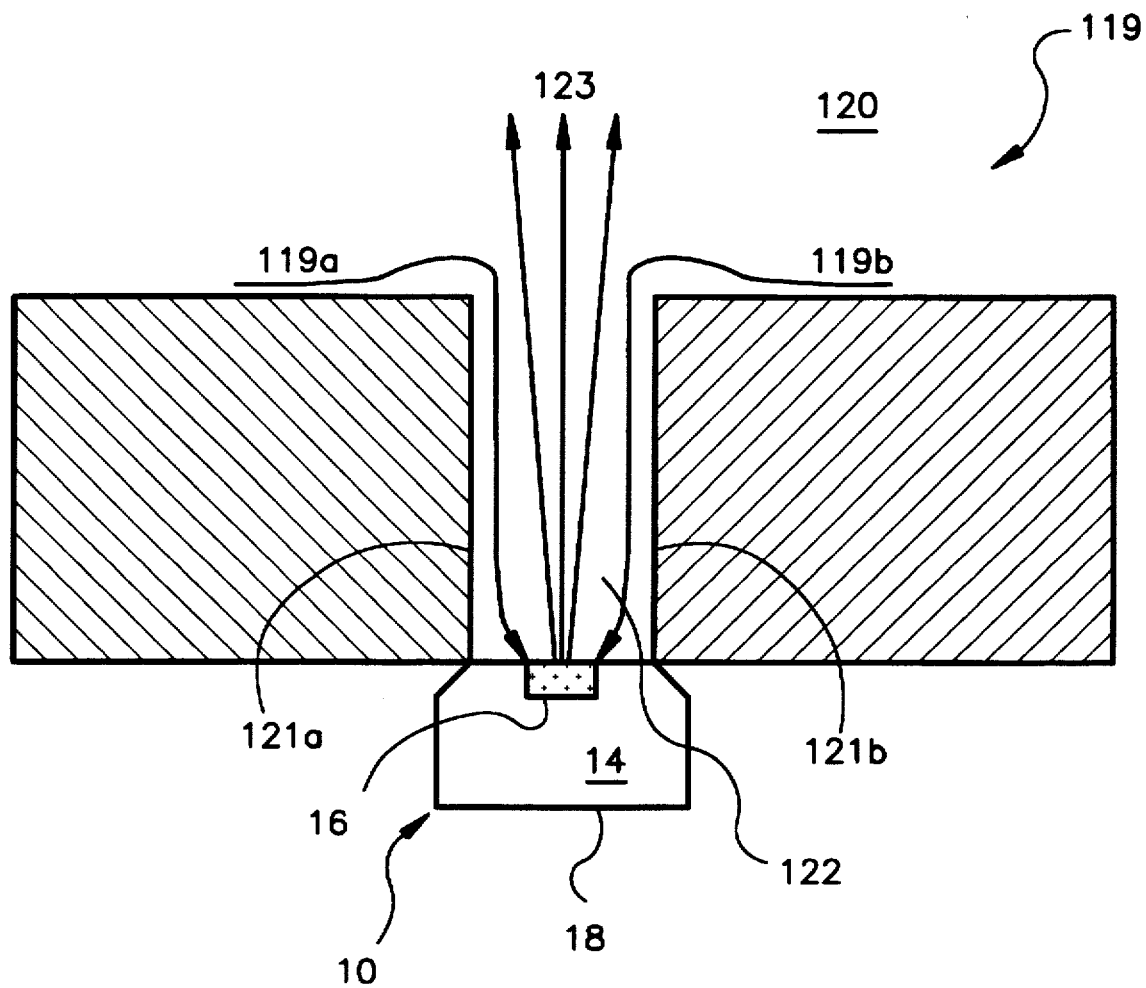
FIG. 9 is a schematic cross-sectional side view of a system wherein a synthetic jet actuator (as depicted in FIG. 1A) is used to improve uniformity of particle or ion deposition in a high aspect ratio channel.

The preferred embodiment of a system for a synthetic jet actuator 10 to cause fluid (depicted by arrows 119a and 119b) from a fluid flow field 120 to travel down the walls 121a & 121b of a channel 122 is depicted in FIG. 9. In this embodiment, a synthetic jet actuator 10 is placed at the bottom of a channel 122. The channel 122 is bounded by solid walls 121a & 121b. When functioning, the synthetic jet actuator 10 produces a stream of fluid 123 traveling up through the channel 122. A synthetic jet actuator 10 is zero net mass in nature and, therefore, must replenish the fluid supply in its chamber 14 from ambient fluid 120 as the synthetic jet actuator diaphragm 18 increases the volume of the synthetic jet chamber 14. Since a stream of fluid 123 is traveling through the center of the channel 122, the fluid from the ambient fluid field 120 must travel down the channel 122 next to the channel walls 121a & 121b as depicted by arrow 119a and arrow 119b. This process allows the ambient fluid 120 to coat the channel walls 121a & 121b more evenly than if no synthetic jet 10 were used in the process.

III. A Synthetic Jet Within A Bounded Volume

A. Mixing Fluids in a Bounded Volume

Figure 10:
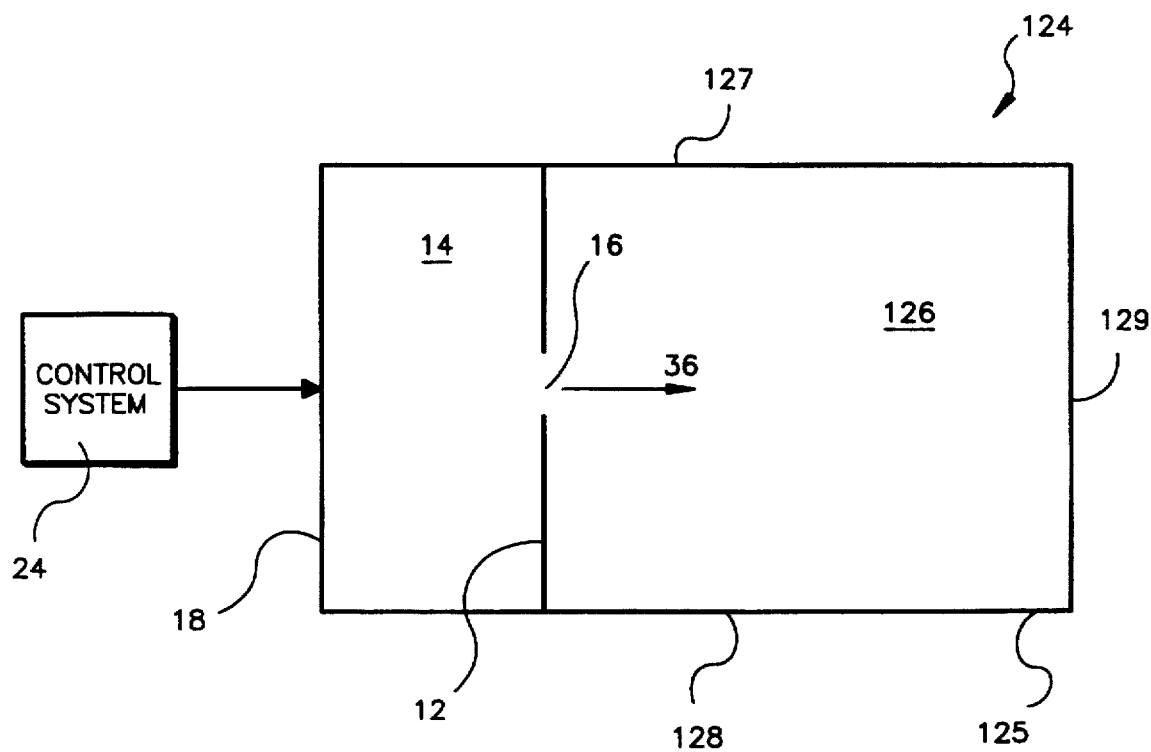
FIG. 10 is a schematic cross-sectional side view of a synthetic jet mixing system having the synthetic jet actuator of FIG. 1A and employed within a bounded volume.

The preferred embodiment of a closed volume mixing apparatus 124 is pictured in FIG. 10. The mixing apparatus 124 comprises a rectangularly cubic housing 125 defining a sealed chamber 126. The chamber 126 is defined in the two-dimensional depiction of FIG. 10 by a lower housing wall 128, an upper housing wall 127, a right housing wall 129, the final end of the mixing apparatus chamber 124 is comprised of the front housing 12 of a synthetic jet actuator 10 (as depicted in FIG. 1A) with the orifice 16 of the actuator 10 facing the inside the mixing apparatus chamber 126. One wall of the synthetic jet actuator housing 12 comprises a flexible material comprising a diaphragm 18. The diaphragm 18 is caused to vibrate at a high frequency by a control mechanism 24. When the diaphragm 18 is excited by the control mechanism 24, a synthetic jet stream 36 is produced in the chamber 126 originating in the region around the orifice 16 in the synthetic jet actuator housing 12 and propagating in a direction away from the housing wall constituting the diaphragm 18. The vortices within this turbulent flow 36, aid the mixing of fluid in the chamber 126.

B. Heat Transfer

Figure 11:
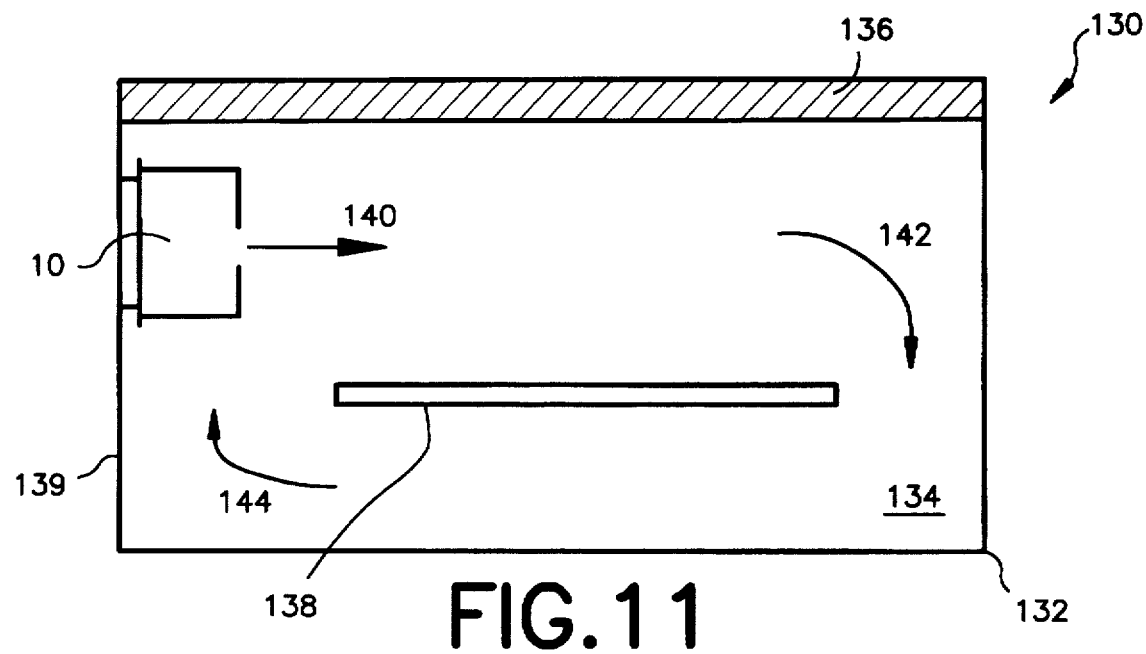
FIG. 11 is a schematic cross-sectional side view of a synthetic jet cooling system having the synthetic jet actuator of FIG. 1A and employed within a bounded volume.

FIG. 11 depicts the preferred embodiment of a general bounded volume synthetic jet heat transfer system 130. This system comprises elements of a housing 132 defining a closed chamber 134. In the present example, a rectangularly cubic chamber 134 has been selected. However, any shape of chamber 134 may be defined by said housing 132.

In FIG. 11, the upper wall of the housing 132 has a heated surface 136. For example, this heated surface 136 could comprise a microcomputer chip array or other device that produces heat as a by-product of functioning. Within the chamber 134, a heat sink surface 138 is placed. This heat sink surface 138 may be completely contained in the chamber 134, or it may protrude out of the chamber 134 through one of the walls of the housing 132 in order to expose this surface 138 to cooler fluid outside of the housing 132. Furthermore, the heat sink surface 138 may be of several different shapes in order to facilitate heat transfer from the fluid to this heat sink surface 138.

A synthetic jet actuator 10 is placed in the chamber 134 against one of the side walls 139 of the housing 132 and positioned such that the fluid flow generated 140 will flow along the heat emitting surface 136. Typically, the chamber 134 will be designed such that the synthetic jet flow 140 can pass completely around the heat sink surface 138 forming a flow cycle, depicted in FIG. 11 by arrow 142 and arrow 144.

As the jet 140 passes the heated surface 136, the strong turbulence of the flow 140 draws heated fluid directly adjacent to the heated surface 136 into the stream of fluid 140. The jet stream 140 mixes the fluid quite well due to the strong entrainment and strong turbulence inherent to a synthetic jet flow 140. This mixing will allow some of the heated fluid drawn away from the heated surface 136 to deposit some of the its heat into the heat sink surface 138. However, because the flow 140 can cycle around the chamber 134, as depicted by arrows 142 and 144, the heat will be given even more time to transfer heat to either the heat sink surface 138 or a cooler wall of the housing 132.

Figure 12:
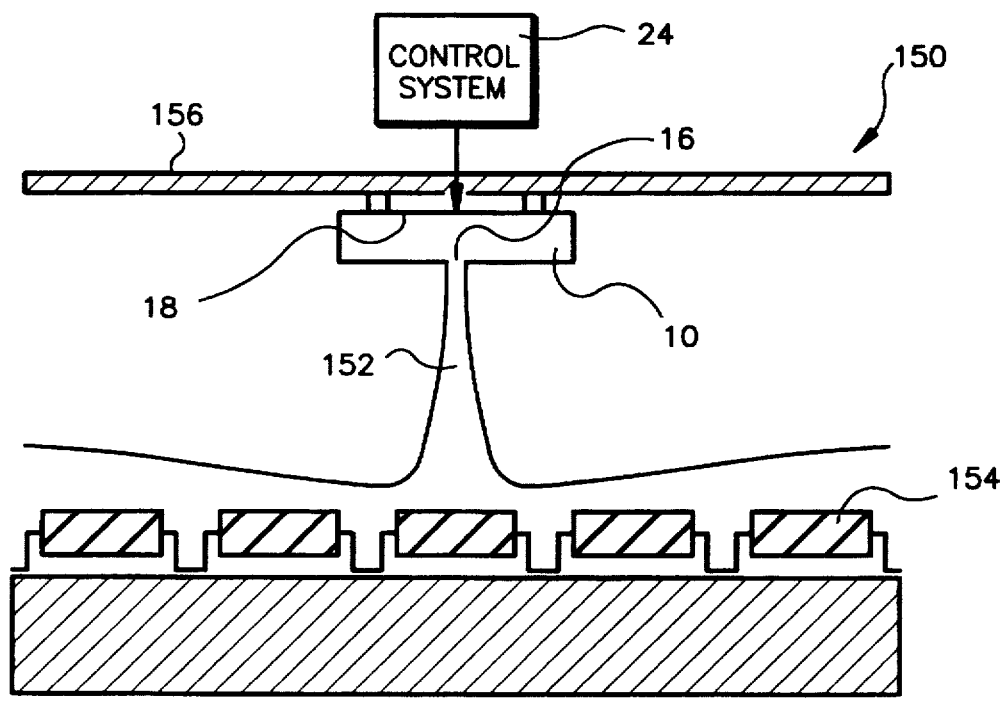
FIG. 12 is a schematic cross-sectional side view of a synthetic jet cooling system having a synthetic jet actuator of FIG. 1A and used to augment normal convective cooling of a heated body.

Another embodiment 150 for a heat transfer system is one as depicted in FIG. 12. This system also involves a bounded volume, but the difference from the system just described is that the flow 152 out of the synthetic jet actuator 10 directly impinges on a heat producing object 154, or area as depicted in FIG. 12.

In the configuration 150 shown in FIG. 12, the synthetic jet actuator 10 is mounted on a surface 156 opposite to a heat producing body 154. As depicted in the FIG. 12, the heat producing body 154 is a microchip array; however, any heat producing body would suffice. When the diaphragm 18 of the synthetic jet actuator 10 is vibrated by some excitation means 24, a flow 152 is produced which radiates from the synthetic jet orifice 16 and impinges on the heated surface 154.

Optimally, the mounting surface 156 should be positioned at a distance of 16 times the diameter of the synthetic jet orifice from the heat producing body 154. Furthermore, the synthetic jet actuator 10 should be positioned such that the centerline of the flow 152 strikes the center of the heat producing body 154.

Use of a synthetic jet actuator 10 in cooling a heat producing body 154 is a significant advance over mere unassisted convective cooling. Additionally, the heat producing body 154 is cooled without any net mass injection into the bounded volume system 150.

IV. Micromachined Synthetic Jet Actuator

Many embodiments of the novel invention disclosed herein may require that the synthetic jet actuator used be of very small size. To accommodate this requirement, the synthetic jet actuator can be micromachined to form what may be called a microjet actuator. Microjet actuators can be used in macro flow control and other applications involving interaction of a microjet with another fluid flow as well as situations requiring fluid flow in a bounded volume. FIG. 13 depicts a cross-section of the preferred embodiment of a microjet actuator, denoted generally by reference numeral 160. In the preferred embodiment, the microjet actuator. 160 comprises the elements of an orifice 161 situated atop a sealed chamber 162 which is bounded opposite the orifice 161 by a flexible membrane 164. Vibration of the membrane 164 by some excitation means 165, preferably either electrostatic or piezoelectric actuation, results in a turbulent fluid flow, as depicted by arrow 166, formed generally normal to the microjet orifice 161. The fluid flow 166 from the microjet actuator 160 is produced by the same physical interactions which were described above for larger synthetic jets. Although possible to do otherwise, in the preferred embodiment of a microjet actuator 160, the orifice 161 and the membrane 164 are incorporated into the same silicon wafer 168.

FIGS. 14A through 14E depict the various steps which are taken to create the preferred embodiment of a microjet actuator 160 (FIG. 13). Starting with a high resistivity two inch <100> silicon wafer 168 that is polished on both sides, a layer of silicon dioxide 169 (about 1 micron in thickness) is formed using wet thermal oxidation, as shown in FIG. 14A. On the front side of the wafer 168, a 3000Å layer of aluminum is deposited using DC sputtering. Photolithography is then used to pattern a square orifice hole 170 in the aluminum. This hole 170 is designed to be about 265 microns on a side. Using the patterned aluminum as a mask for infrared alignment, a matching orifice hole 172 is created on the back side of the wafer 168 using a photolithography process.

FIG. 14B depicts the next step in the formation process. Using the patterned silicon dioxide 169 as an etch mask, the jet orifice 161 is anisotropically etched using a 20% potassium hydroxide solution in water at about 600° C.

As shown in FIG. 14C, a photolithography process is then used to form a square actuator hole 174 in the back-side oxide 169. The actuator hole 174, as depicted, measures approximately 3 mm on a side.

As shown in FIG. 14D, this actuator hole 174 is deepened to form the actuator cavity 172 by anisotropically etching to a depth of about 15 microns using a timed etch comprising 20% potassium hydroxide in water at about 50° C.

The wafer 168, as shown in FIG. 14E, is then re-oxidized using thermal oxidation such that a layer of 2500Å of silicon dioxide 178 is formed in the etched region 176 (the actuator cavity). A 3000Å thick layer of aluminum 180 is then sputtered on the back side of the wafer 168 to act as an electrode for electrostatic actuation. A layer of polyimide film 182 is bonded to the lower side of the wafer 168 to form a flexible actuation diaphragm 182. This polyimide film 182 is then coated with a layer of about 3000Å of aluminum 184 using DC sputtering to provide the second electrode for electrostatic actuation.

For some embodiments, whole arrays of microjet actuators may be desired. Several approaches have been developed to create arrays. One approach focuses on the development of a hybrid microjet actuator assembly (denoted generally by number 190) as illustrated in FIG. 15A. In this design 190, both the orifice 192 and diaphragm 198 of each microjet actuator are incorporated into the same silicon wafer 196. The techniques used to manufacture such an array are similar to those just outlined for a single microjet actuator 160 (as depicted in FIG. 13). In the preferred embodiment, both the depicted orifices 192 and the depicted cavities 194 are batch fabricated from a <100> silicon wafer 196 using micromachining techniques. The length of an orifice 192 is defined by the thickness of the silicon wafer 196, typically about 250 microns, while the depth of the cavity 194 is approximately 15 microns. Typical orifice lateral dimensions range from 50–800 microns and typical cavity lateral dimensions range from 1 mm to 4 mm. The only difference from the fabrication technique outlined above for a single microjet is that instead of only one microjet actuator 160 per wafer 168 (as depicted in FIG. 13), a whole series of microjet actuators are fabricated in the same wafer 196 (as depicted in FIG. 15A).

Another approach for manufacturing an individually addressable microjet actuator array 200 fabricated with an integrated polyimide membrane 198 (FIG. 15B) is as follows. Starting with a high resistivity <100> silicon wafer 196, a silicon dioxide layer is grown using wet thermal oxidation. As depicted in FIG. 16A, photolithography is then used to patter a silicon dioxide layer on the front side to form the microjet cavity 194. Using the patterned oxide layer as an etch mask, the cavity recess 194 is then time-etched anisotropically in a potassium hydroxide solution.

An electroplating seed layer is then deposited onto the front side using thermal evaporation. Photolithography is then used to pattern a photoresist electroplating mold. As depicted in FIG. 16B, the etched recess 194 is then filled with electroplated nickel 202.

FIG. 16C depicts the next few steps. After removing the plating mold and the exposed seed layer, photolithography is used to transfer the orifice pattern to the silicon dioxide layer on the back side of the wafer 196. Infrared alignment is used to ensure that the outer orifice hole 204 is aligned with the nickel-filled cavity 202. Again, using the patterned oxide as an etch mask, the orifice 192 is anisotropically etched in a potassium hydroxide solution. The integrated polyimide membrane 198 is then formed by spin coating multiple layers of DuPont PI 2611 polyimide onto the front side of the wafer 196 over the nickel-filled cavity recesses 202.

After curing the polyimide, the seed layer and nickel 202 are removed, as shown in FIG. 16D, from the cavity 194 through the orifice hole 192 by wet etching, thus releasing the polyimide membrane 198 for actuation. Finally, the membrane electrode 195 is evaporated onto the top of the membrane 198 through a shadow mask. The silicon wafer 196 is used as the second electrode for electrostatic actuation.

In both methods of microjet actuator array manufacture, individual jet control is achieved by use of the metallized flexible polyimide diaphragm 198. The metal electrodes 195 on the diaphragm 198 are patterned so that voltage can be individually applied to the region over each actuator cavity 194. A key feature of this design is that the diaphragm 198 can be vibrated using either a commercial piezoelectric transducer to drive all array elements in parallel or a sinusoidal drive voltage applied to the flexible diaphragm 198 of individual array elements. Driving the membrane 198 in either fashion results in cavity 194 pressure variations and a jet flow through the orifice 192. An individual jet is modulated by either reducing the amplitude of the drive voltage of an individual array element for electrostatic drive or by electrostatically modulating the diaphragm 198 vibration amplitude for that element (for piezoelectric drive).

Wherefore, the following is claimed:

1. A system for modifying a direction of a primary jet stream of a primary fluid, comprising:
    (a) a synthetic jet actuator having:
        (1) a jet housing defined by walls, said jet housing having an internal chamber with a volume of ambient fluid and an opening in said jet housing connecting said chamber to an external environment having the ambient fluid;
        (2) a volume changing means for periodically changing the volume within the internal chamber so that vortex sheets are generated at the opening, the vortex sheets detaching from the opening and forming vortices projecting into the external environment;
        (3) the fluid vortices forming a synthetic jet stream through entrainment of the ambient fluid outside of said jet housing; and
    (b) a primary stream of primary fluid, said primary stream positioned to contact the synthetic jet stream of ambient fluid, the direction of the primary jet stream being modified by the synthetic jet stream.

2. The system of claim 1, wherein said volume changing means comprises a flexible diaphragm that serves as one of said walls of said jet housing, said diaphragm being positioned so that the ambient fluid is moved in and out of the opening during movement of said diaphragm.

3. The system of claim 1, wherein said volume changing means comprises a piston positioned in said jet housing to move so that the ambient fluid is moved in and out of the opening during reciprocation of said piston.

4. The system of claim 1, further comprising a primary jet having a jet body with a primary jet orifice in the jet body, wherein said primary stream is emitted from the primary jet orifice situated along a first axis that is substantially parallel to a second axis, said second axis aligned with the opening and wherein said primary stream is caused to move away from the first axis.

5. The system of claim 2, wherein said diaphragm comprises a metal layer and wherein a metal electrode is disposed adjacent to but spaced from said metal layer so that said diaphragm can be moved via an electrical bias imposed between said electrode and said metal layer.

6. The system of claim 4, wherein the opening is positioned relative to the primary jet orifice so that said primary stream is entrained to an extent by the synthetic jet stream and caused to bend toward the opening.

7. The system of claim 1, wherein the ambient fluid comprises an ambient gas and the primary fluid comprises a primary gas.

8. The system of claim 7, wherein ambient gas flows into said internal chamber of said jet housing as the volume of said internal chamber is increased by said volume changing means, said ambient fluid only flowing into said internal chamber through the opening.

9. An apparatus for vectoring a fluid jet stream, comprising:

(a) a primary jet having an external housing, said primary jet expelling a primary fluid stream into an external environment having an ambient fluid;

(b) a synthetic jet actuator adjacent to said primary jet, said synthetic jet actuator having:

a jet housing defined by walls, said jet housing having an internal chamber with a volume of ambient fluid and an opening in said jet housing connecting said chamber to the external environment, a means for generating vortex sheets at the opening in said housing, the vortex sheets projecting into the external environment and forming fluid vortices, and the fluid vortices forming a synthetic jet stream through entrainment of the ambient fluid; and (c) the primary fluid stream contacting the synthetic jet stream, the primary jet stream being vectored by the synthetic jet stream.

10. The apparatus of claim 9, wherein said primary fluid and said ambient fluid comprise gasses.

11. The apparatus of claim 9, wherein said means for generating vortex sheets comprises:

a flexible membrane forming a portion of said jet housing; and a means for moving said flexible membrane in periodic motion, wherein the volume of said housing is modified.

12. The apparatus of claim 11, wherein said moving means comprises a vibrating piezoelectric element attached to said flexible membrane.

13. The apparatus of claim 11, wherein said housing is sealed such that the ambient fluid may only pass into and out of the internal chamber by way of the opening.

14. The apparatus of claim 9, wherein said primary fluid comprises combustion products.

15. The apparatus of claim 14, wherein said synthetic jet actuator is attached to said primary jet external housing such that said synthetic jet stream entrains a portion of the primary jet stream into the synthetic jet stream, causing the primary jet stream to vector toward said synthetic jet actuator.

16. A synthetic jet actuator for vectoring a primary flow of gas, said actuator comprising:

a housing defined by walls, said housing having an internal chamber with a volume of ambient gas therein, one of the housing walls having an opening for fluid communication between the internal chamber and an external environment of ambient gas; and a means for generating vortex sheets of ambient gas at the opening of the internal chamber, the vortex sheets projecting into the external environment and forming a synthetic jet stream, wherein the synthetic jet actuator vectors the primary flow of gas by entraining a portion of the primary flow of gas into the synthetic jet stream.

17. The synthetic jet actuator of claim 16, wherein said housing is sealed such that the ambient gas may only pass into and out of the internal chamber by way of the opening.

18. The synthetic jet actuator of claim 17, wherein said generating means comprises a piston positioned in said jet housing to move so that the ambient gas is moved in and out of the opening during reciprocation of said piston.

19. The synthetic jet actuator of claim 18, wherein said generating means comprises:

flexible membrane forming a portion of one of said jet housing walls; and a means for moving said flexible membrane in periodic motion, wherein the volume of said housing is periodically modified.

20. The synthetic jet actuator of claim 19, wherein said moving means comprises a vibrating piezoelectric element attached to said flexible membrane.

* * * * *